United States Patent
Briggs

(10) Patent No.: US 9,086,435 B2
(45) Date of Patent: Jul. 21, 2015

(54) CIRCUITS FOR SENSING CURRENT LEVELS WITHIN A LIGHTING APPARATUS INCORPORATING A VOLTAGE CONVERTER

(75) Inventor: Gerald Edward Briggs, Ottawa (CA)

(73) Assignee: ARKALUMEN INC., Ottawa (CA)

( * ) Notice: Subject to any disclaimer, the term of this patent is extended or adjusted under 35 U.S.C. 154(b) by 248 days.

(21) Appl. No.: 13/548,187

(22) Filed: Jul. 12, 2012

(65) Prior Publication Data

US 2013/0009561 A1     Jan. 10, 2013

Related U.S. Application Data

(63) Continuation-in-part of application No. 13/104,919, filed on May 10, 2011, now Pat. No. 8,564,214, and a continuation-in-part of application No. 13/104,926, filed on May 10, 2011.

(60) Provisional application No. 61/507,117, filed on Jul. 12, 2011.

(51) Int. Cl.
| H05B 37/00 | (2006.01) |
|---|---|
| G01R 19/00 | (2006.01) |
| H05B 33/08 | (2006.01) |
| G01R 1/20 | (2006.01) |

(52) U.S. Cl.
CPC ........ *G01R 19/0092* (2013.01); *H05B 33/0851* (2013.01); *G01R 1/203* (2013.01)

(58) Field of Classification Search
USPC ............. 315/210, 285 R, 186, 192, 291, 294, 315/297, 312
See application file for complete search history.

(56) References Cited

U.S. PATENT DOCUMENTS

| 4,593,234 A | 6/1986 | Yang |
|---|---|---|
| 5,006,782 A | 4/1991 | Pelly |
| 5,237,264 A | 8/1993 | Moseley et al. |
| 5,248,919 A | 9/1993 | Hanna et al. |
| 5,783,909 A | 7/1998 | Hochstein |
| 5,803,579 A | 9/1998 | Turnball et al. |
| 5,932,995 A | 8/1999 | Wagoner |
| 5,949,539 A | 9/1999 | Britton, Jr. et al. |
| 6,175,195 B1 | 1/2001 | Janczak et al. |
| 6,198,230 B1 | 3/2001 | Leeb et al. |
| 6,222,352 B1 | 4/2001 | Lenk |
| 6,351,079 B1 | 2/2002 | Willis |
| 6,400,482 B1 | 6/2002 | Lupton et al. |
| 6,426,599 B1 | 7/2002 | Leeb |
| 6,504,633 B1 | 1/2003 | Hovorka et al. |
| 6,548,967 B1 | 4/2003 | Dowling et al. |
| 6,596,977 B2 | 7/2003 | Muthu et al. |

(Continued)

*Primary Examiner* — Tung X Le
(74) *Attorney, Agent, or Firm* — Sean Murray; Murray IP Consulting Inc.

(57) ABSTRACT

Circuits for sensing current levels within an apparatus are disclosed. In specific cases, a constant voltage power supply is used to power an LED lighting apparatus in which there are uncertainties within the forward voltages of the LEDs, which in turn creates uncertainty with respect to the current level flowing through the LEDs. To manage these uncertainties, the current flowing through the LEDs is measured by determining a voltage level across a known resistor and calculating the current level. To prevent the known resistor from causing a significant reduction in the efficiency of the overall light engine, the circuit includes one or more transistors in parallel with the known resistor to reduce the effective resistance in the LED circuit during times that the current is not being sensed.

26 Claims, 12 Drawing Sheets

(56) References Cited

U.S. PATENT DOCUMENTS

| | | |
|---|---|---|
| 6,621,235 B2 | 9/2003 | Chang |
| 6,794,831 B2 | 9/2004 | Leeb et al. |
| 6,853,150 B2 | 2/2005 | Clauberg et al. |
| 6,954,591 B2 | 10/2005 | Lupton et al. |
| 7,016,115 B1 | 3/2006 | Leeb et al. |
| 7,141,779 B1 | 11/2006 | Chew et al. |
| 7,321,203 B2 | 1/2008 | Marosek |
| 7,352,135 B2* | 4/2008 | Shiotsu et al. ............... 315/247 |
| 7,457,089 B2 | 11/2008 | Ohshima |
| 7,486,032 B2 | 2/2009 | Lee |
| 7,495,425 B2 | 2/2009 | Friedrich |
| 7,498,754 B2 | 3/2009 | Masood |
| 7,511,463 B2 | 3/2009 | Kumar |
| 7,649,326 B2 | 1/2010 | Johnson et al. |
| 7,750,616 B2 | 7/2010 | Liu |
| 7,759,881 B1 | 7/2010 | Melanson |
| 8,587,203 B2* | 11/2013 | Chen et al. ............... 315/121 |
| 2005/0127888 A1 | 6/2005 | Marschalkowski et al. |
| 2005/0225264 A1 | 10/2005 | Kemp |
| 2005/0269580 A1 | 12/2005 | D'Angelo |
| 2006/0113975 A1 | 6/2006 | Mednik et al. |
| 2006/0239689 A1 | 10/2006 | Ashdown |
| 2007/0103086 A1 | 5/2007 | Neudorf et al. |
| 2007/0103832 A1 | 5/2007 | Ohshima |
| 2007/0159421 A1 | 7/2007 | Peker et al. |
| 2007/0182338 A1 | 8/2007 | Shteynberg et al. |
| 2007/0195552 A1 | 8/2007 | Park |
| 2007/0229047 A1 | 10/2007 | Sigamani et al. |
| 2007/0268028 A1 | 11/2007 | Moyer et al. |
| 2007/0278974 A1 | 12/2007 | Van De Van |
| 2008/0079705 A1 | 4/2008 | Yang et al. |
| 2008/0138085 A1 | 6/2008 | Lin et al. |
| 2008/0150449 A1 | 6/2008 | Wang et al. |
| 2008/0191642 A1 | 8/2008 | Slot et al. |
| 2008/0224636 A1 | 9/2008 | Melanson |
| 2008/0252664 A1 | 10/2008 | Huang et al. |
| 2009/0096392 A1 | 4/2009 | Chandran et al. |
| 2009/0134817 A1 | 5/2009 | Jurngwirth et al. |
| 2009/0160422 A1* | 6/2009 | Isobe et al. ............... 323/349 |
| 2009/0174337 A1 | 7/2009 | Miskin et al. |
| 2009/0251071 A1 | 10/2009 | Gater et al. |
| 2009/0322252 A1 | 12/2009 | Shiu et al. |
| 2010/0033146 A1 | 2/2010 | Irissou et al. |
| 2010/0066266 A1 | 3/2010 | Huang et al. |
| 2010/0072899 A1 | 3/2010 | Engstrand |
| 2010/0072902 A1* | 3/2010 | Wendt et al. ............... 315/161 |
| 2010/0079124 A1 | 4/2010 | Melanson |
| 2010/0102230 A1 | 4/2010 | Chang et al. |
| 2010/0164406 A1 | 7/2010 | Kost et al. |
| 2010/0171429 A1 | 7/2010 | Garcia et al. |
| 2010/0171442 A1 | 7/2010 | Draper et al. |
| 2010/0177127 A1* | 7/2010 | Akiyama et al. ............... 345/690 |
| 2010/0194308 A1* | 8/2010 | Zhao et al. ............... 315/297 |
| 2010/0277075 A1 | 11/2010 | Rees |
| 2010/0289424 A1 | 11/2010 | Chang et al. |
| 2010/0320936 A1 | 12/2010 | Yao |
| 2011/0006691 A1 | 1/2011 | Blaha et al. |
| 2011/0050130 A1 | 3/2011 | Rudolph |
| 2011/0115394 A1 | 5/2011 | Shteynberg et al. |
| 2011/0187313 A1* | 8/2011 | Lee ............... 320/107 |
| 2011/0298386 A1 | 12/2011 | Corradi |

* cited by examiner

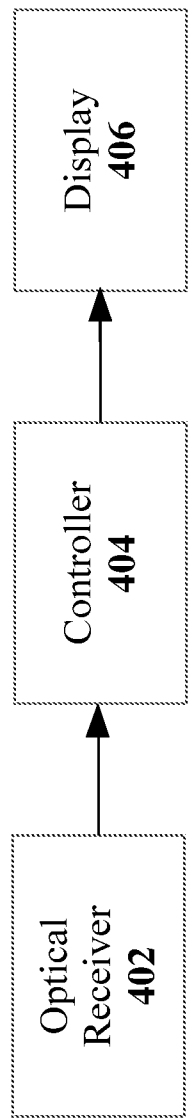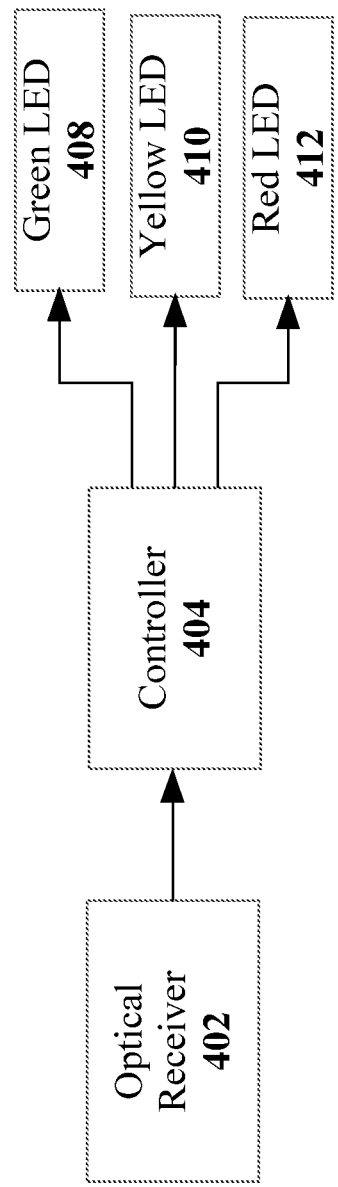
FIGURE 4A
FIGURE 4B

CIRCUITS FOR SENSING CURRENT LEVELS WITHIN A LIGHTING APPARATUS INCORPORATING A VOLTAGE CONVERTER

CROSS-REFERENCE TO RELATED APPLICATION

The present application is a continuation in part of and claims the benefit under 35 USC 120 of U.S. patent application Ser. No. 13/104,919 entitled "Circuits for Sensing Current Levels Within Lighting Apparatus" by Briggs filed on May 10, 2011 and U.S. patent application Ser. No. 13/104,926 entitled "Methods and Apparatus for Changing a DC Supply Voltage Applied to a Lighting Circuit" by Briggs filed on May 10, 2011, both of which are hereby incorporated by reference. The present application further claims the benefit under 35 USC 119(e) of U.S. Provisional Patent Application No. 61/507,117 entitled "Dimmable LED Lighting Architecture Incorporating a Voltage Converter" by Briggs filed on Jul. 12, 2011 and hereby incorporated by reference.

FIELD OF THE INVENTION

The invention relates generally to lighting apparatus and, more particularly, to circuits for sensing current levels within lighting apparatus.

BACKGROUND

Light Emitting Diodes (LEDs) are increasingly being adopted as general illumination lighting sources due to their high energy efficiency and long service life relative to traditional sources of light such as incandescent, fluorescent and halogen. Each generation of LEDs are providing improvements in energy efficiency and cost per lumen, thus allowing for lighting manufacturers to produce LED light fixtures at increasingly cost competitive prices.

While the component LEDs are increasing in energy efficiency, there are considerable other components within an LED light fixture that cause drains on the overall lumens per Watt achievable within the overall system. For instance, inefficiencies within the optics used and the AC/DC power supply both reduce the overall energy efficiency for the light fixture. Further, operating the LEDs at non-optimal current (amperage) levels can reduce the energy efficiency of the LEDs and therefore the overall light fixture. In fact, if the current flowing through the LEDs exceeds a maximum allowable level, the LEDs may be damaged or permanently burnt out, and thus require replacement.

One issue that arises when managing the current flow through the LEDs is that LEDs are not constant in terms of their forward voltages (voltage drops), or other characteristics such as color/color temperature and brightness. Each LED that is manufactured is generally categorized based on a number of criteria including their forward voltage, this categorization being based on bin codes and therefore called "binning" In manufacturing light fixtures with LEDs, the developer will generally want a consistent light output from each of its "identical" light fixtures. To do this, the manufacturer will select the binning of its LEDs to be consistent. A problem that arises is that the more narrow the binning criteria provided by the developer, the higher prices that are typically charged for the LEDs. On the other hand, it becomes difficult to design a circuit for the LEDs if the uncertainty related to the forward voltages of the LEDs is significant.

In some architectures, the LED light fixtures are powered with a constant current power supply that can be locked to a particular current through a feedback control system using an inductor. In this architecture, the control system can manage differences in forward voltages within the LEDs within a predefined limit.

In other architectures, a constant voltage power supply is used and the current to flow through the LEDs is controlled by the voltage output from the voltage power supply and the impedances within the circuit. In this case, differences in forward voltages across LEDs within different light fixtures can make a significant difference in the current flowing through the LEDs. Further, the voltage output from the constant voltage power supply may be adjustable and adjustments in the voltage supply can further change the current flowing through the LEDs.

In other architectures, the voltage output from the constant voltage power supply may not be adjustable. Constant voltage power supplies having a fixed output voltage, for example 24V, may be more readily available and economical compared to constant voltage power supplies having an adjustable output voltage. In these architectures, a voltage converter may be connected between the power supply and LEDs so that the voltage applied to the LEDs may be set appropriately to control the current flowing through the LEDs to account for varying operating conditions. Certain voltage converter designs employ a feedback control system to measure the current through the voltage converter that in many cases introduces further inefficiencies into a lighting apparatus.

Against this background, there is a need for solutions that will mitigate at least one of the above problems and, in particular, to enable monitoring and/or control of the current flowing through the LEDs while not materially decreasing the efficiency of the system.

SUMMARY OF THE INVENTION

In an embodiment of the invention there is provided a circuit comprising: a voltage converter operable to receive an input voltage and generate an output voltage defined between a high voltage rail and a low voltage rail coupled to the output of the voltage converter; a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and a current determination apparatus coupled to the current sense circuit and operable to sample a current sense voltage at the node during the second state.

In another embodiment of the invention there is provided a circuit comprising: a voltage converter operable to receive an input voltage and generate an output voltage, defined between a high voltage rail and a low voltage rail coupled to the output of the voltage converter, the output voltage being based at least partially on a voltage control signal received by the voltage converter; at least one LED channel coupled between the high voltage rail and the low voltage rail; a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and a controller operable to sample a current sense voltage at the node during the second state and to set the voltage control signal based at least partially on data related to the current sense voltage to set the output voltage.

In a further embodiment of the invention there is provided a method of controlling a lighting circuit comprising: operating a current sense circuit in a first state when not sampling a current sense voltage; setting the current sense circuit to a second state and sampling the current sense voltage when the current sense circuit is in the second state; and setting a voltage control signal to set an output voltage of a voltage converter based at least partially on data related to the current sense voltage.

These and other aspects of the invention will become apparent to those of ordinary skill in the art upon review of the following description of certain embodiments of the invention in conjunction with the accompanying drawings.

BRIEF DESCRIPTION OF THE DRAWINGS

A detailed description of embodiments of the invention is provided herein below, by way of example only, with reference to the accompanying drawings, in which:

FIGS. 4A and 4B are logical block diagrams of a current level display apparatus according to particular example implementations of the present invention in which the LED lighting apparatus of FIG. 2A communicates information optically;

It is to be expressly understood that the description and drawings are only for the purpose of illustration of certain embodiments of the invention and are an aid for understanding. They are not intended to be a definition of the limits of the invention.

DETAILED DESCRIPTION OF EMBODIMENTS

The present invention is directed to circuits for sensing current levels within apparatus. In embodiments of the present invention, a constant voltage power supply is used to power an LED lighting apparatus in which there are uncertainties within the forward voltages of the LEDs, which in turn creates uncertainty with respect to the current level flowing through the LEDs. To manage these uncertainties, the current flowing through the LEDs is measured by determining a voltage level across a known resistor and calculating the current level. To prevent the known resistor from causing a significant reduction in the efficiency of the overall light engine, the circuit includes one or more transistors in parallel with the known resistor to reduce the effective resistance in the LED circuit during times that the current is not being sensed.

Figure 1:
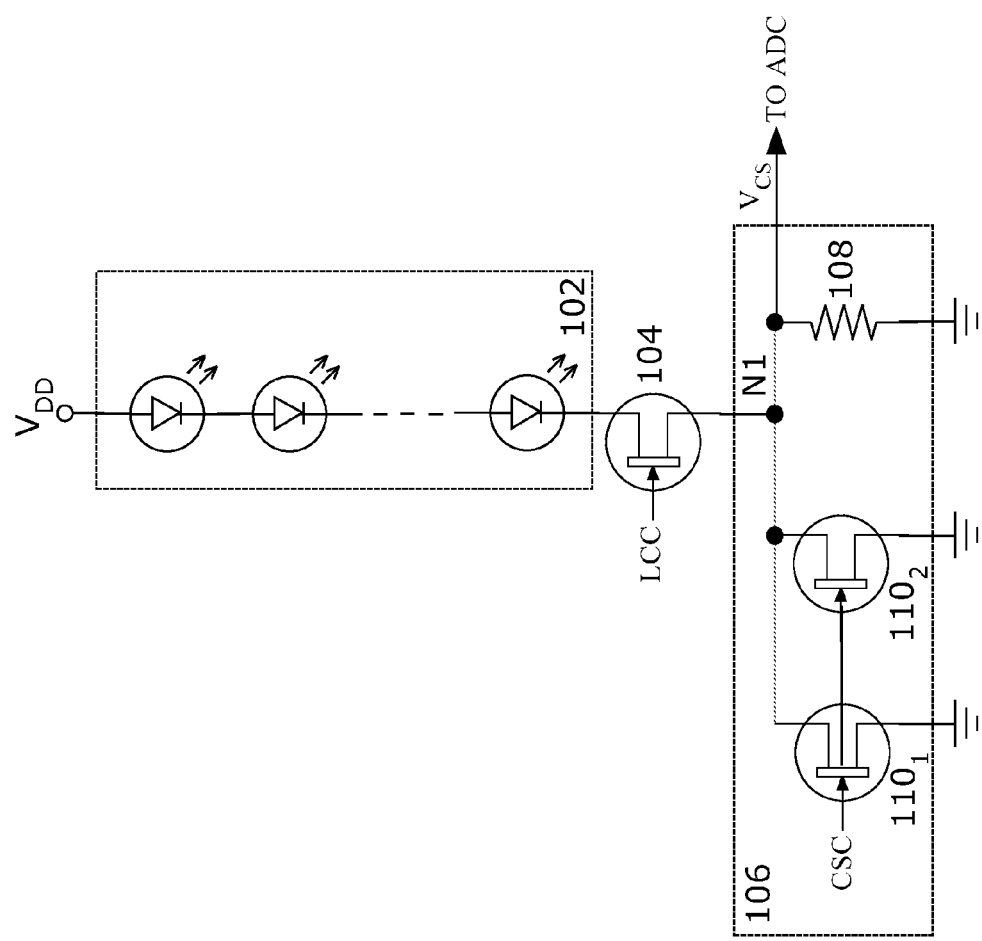
FIG. 1 is an electrical circuit diagram of a light engine according to one embodiment of the present invention.

FIG. 1 is an electrical circuit diagram of a light engine according to one embodiment of the present invention. As shown, the circuit of FIG. 1 comprises a plurality of LEDs 102 coupled in series with a channel control transistor 104 and a current sense circuit 106 between a supply voltage $V_{DD}$ and a reference ground. The current sense circuit 106 comprises a current sense resistor 108 with a resistance $R_A$ coupled in parallel with two current sense control transistors $110_1$, $110_2$ between the channel control transistor 104 and the reference ground.

The channel control transistor 104 is controlled by a Light Channel Control (LCC) signal at its gate/base which dictates when current flows through the LEDs. The LCC signal would generally be a Pulse Width Modulation (PWM) signal that is high and low for periods of time within a duty cycle. The ratio of the time that the LCC signal is high relative to the time that the LCC signal is low dictates the level of light output that would be visible from the LEDs. In particular, if the LCC signal is fully high, the LEDs will be "on" at all times and therefore will project lumens of light 100% of the time. On the other hand, if the LCC signal is 50% high and 50% low, the LEDs will be "on" half the time and therefore the LEDs will dimmed by 50% from the full "on" state. It should be understood that other levels of dimming could be performed by controlling the LCC signal. In some embodiments, the channel control transistor 104 could be removed. In this case, the LEDs 102 would be directly coupled to the current sense circuit 106 and would be always on when the supply voltage is applied.

According to embodiments of the present invention, there are instances that may require a determination of the current flowing through the LEDs 102. The current sense circuit 106 as shown in FIG. 1 is designed to allow for a current sense voltage $V_{CS}$ to be sensed while not substantially decreasing the efficiency of the overall circuit during a substantial portion of the duty cycle of operation. As shown in FIG. 1, the current sense voltage $V_{CS}$ is being sensed at a node N1 coupled between the channel control transistor 104 and the current sense circuit 106. It should be understood that other nodes within the circuit of FIG. 1 could be used to provide a sensed voltage and node N1 is utilized for simplicity. The current sense voltage $V_{CS}$ will be equal to the resistance $R_{CS}$ of the current sense circuit 106 multiplied by the current flowing through the circuit 106. Therefore, with knowledge of the resistance $R_{CS}$ of the current sense circuit and measuring the current sense voltage $V_{CS}$, the current flowing through the circuit 106, and therefore also the current flowing through the LEDs 102, can be calculated.

The current sense voltage $V_{CS}$ is detected at an Analog to Digital Convertor (ADC) (not shown) or another circuit which may be used to create an indication of the voltage $V_{CS}$ on node N1. To provide an accurate detection of the current sense voltage $V_{CS}$, it is desired that the signal to noise ratio of the voltage be relatively high. If the resistance $R_{CS}$ across the current sense circuit 106 is substantially low, the voltage $V_{CS}$ will also be low and potentially difficult to accurately detect relative to noise within the circuit. Therefore, to provide an accurate detection of the current sense voltage $V_{CS}$, it is desirable to have a relatively substantial resistance $R_{CS}$ across the current sense circuit 106. On the other hand, the resistance $R_{CS}$ across the current sense circuit 106 is a source of power loss and, the higher that the resistance $R_{CS}$ is and therefore the higher the accuracy of the voltage measurement, the lower the energy efficiency of the overall circuit of FIG. 1. To deal with this issue, the current sense circuit 106, according to embodiments of the present invention, utilizes the current sense control transistors $110_1, 110_2$ to adjust the resistance $R_{CS}$ across the current sense circuit 106.

The current sense control transistors $110_1, 110_2$ are controlled by a Current Sense Control (CSC) signal at their gates/bases that dictates the resistance across the current sense circuit 106. When the CSC signal is low, the transistors $110_1, 110_2$ are off and the resistance $R_{CS}$ across the current sense circuit 106 is equal to the resistance $R_A$ of the current sense resistor 108. When the CSC signal is high, the transistors $110_1, 110_2$ are on and the resistance $R_{CS}$ across the current sense circuit 106 is:

$$R_{CS} = \frac{1}{\frac{1}{R_1} + \frac{1}{R_2} + \frac{1}{R_A}}$$

where $R_1$ and $R_2$ are the resistances of the drain-source or collector-emitter paths of the transistors $110_1, 110_2$ respectively when turned on. $R_1$ and $R_2$ are also known as the "on resistance" for the transistors $110_1, 110_2$ respectively.

In one particular example implementation, the resistance $R_A$ of resistor 108 may be 0.25Ω while the resistances $R_1, R_2$ may each be 0.025Ω. In this case, the resistance $R_{CS}$ across the current sense circuit 106 when the transistors $110_1, 110_2$ are off would be 0.25Ω while the resistance $R_{CS}$ across the current sense circuit 106 when the transistors $110_1, 110_2$ are on would be ~0.012Ω. In this example, if the current flowing through the current sense circuit 106 is 4.0 A, the power loss when the transistors $110_1, 110_2$ are off would be ~4.0 W while the power loss when the transistors $110_1, 110_2$ are on would be ~0.19 W. This difference in power loss can have a significant difference in the overall energy efficiency of the circuit of FIG. 1.

By normally having the current sense control transistors $110_1, 110_2$ on and only turning the transistors $110_1, 110_2$ off during a limited time for a current sense operation, the overall power loss from the current sense circuit 106 can be minimized. In one implementation, the duty cycle for the circuit of FIG. 1 may be divided into 256 slots. In this case, the intensity of the light output from the circuit can be controlled by adjusting the number of slots in which the LCC signal is high and therefore adjusting the amount of time within the duty cycle that the LEDs 102 are turned on. The time in which the resistance $R_{CS}$ across the current sense circuit 106 is high, and therefore the current sense voltage $V_{CS}$ is desirable for detection, can be controlled by adjusting the number of slots in which the CSC signal is low while the LCC signal is high (since the channel control transistor 104 must be turned on to sense the current flowing through the LEDs 102). For instance, if the CSC signal is low for a single slot of 256 slots, the current sense voltage $V_{CS}$ will be desirable for detection by the ADC during that slot (as long as the LCC signal is high for that slot).

To ensure that the current sense voltage $V_{CS}$ is in equilibrium and not in a transitional state caused by the turning off of the transistors $110_1, 110_2$, in some embodiments, the current sense voltage $V_{CS}$ is measured by the ADC at a later portion of the time that the CSC signal is low. For instance, if a duty cycle is divided into 256 slots and the duty cycle is 1 ms, each slot would comprise ~3.9 μs. In this case, the detection of the current sense voltage $V_{CS}$ may take place 2-3 μs after the transistors $110_1, 110_2$ are turned off. Further, in some embodiments, the measuring of the current sense voltage $V_{CS}$ is performed in a plurality of duty cycles and the overall value is determined by averaging the values detected during the individual duty cycles.

Figure 3:
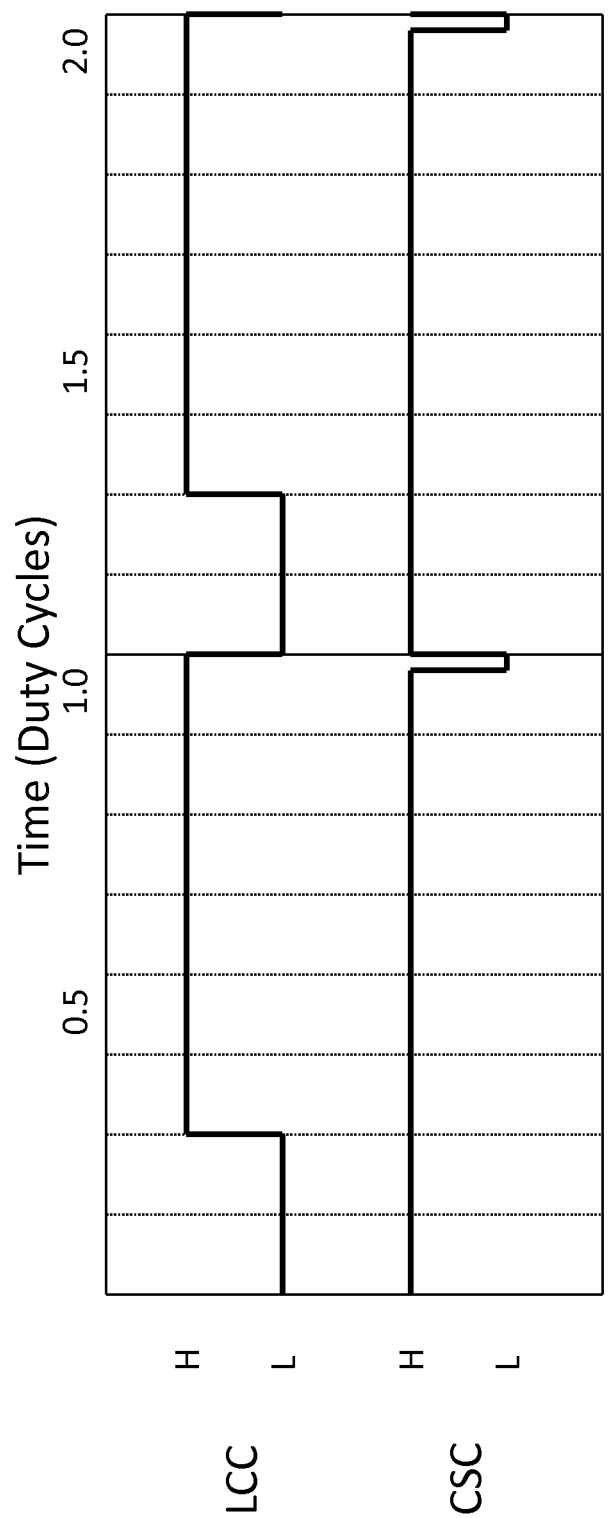
FIG. 3 is a signal flow diagram for a sample duty cycle for a light channel control (LCC) and current sense control (CSC) signals according to a particular example implementation of the present invention.

FIG. 3 depicts a signal flow diagram for a sample duty cycle for the LCC and CSC signals according to a particular example implementation of the present invention. In this case, the LCC signal is low for the first 25% of the duty cycle and is high for the remaining 75% of the duty cycle. The LEDs 102, in this case, would be dimmed by 25% and only be on for 75% of the time of the duty cycle. The duty cycle is typically sufficiently short (for example, 1 ms) such that turning on and off of the LEDs 102 is not perceivable by a human eye but instead appears only as an imperceptible reduction in the average light output from the LEDs 102. As shown in FIG. 3, the CSC signal is high for the first 31 of 32 duty cycle slots and is low for the final duty cycle slot. In this case, when the CSC signal is low and the LCC signal is high, the current sense voltage $V_{CS}$ is desirable to be detected.

If the values of the resistances $R_A$, $R_1$ and $R_2$ are equal to the sample values 0.25Ω, 0.025Ω and 0.025Ω respectively and the current flowing through the current sense circuit 106 is 4.0 A, then the instantaneous power loss due to the current sense circuit 106 for the slots 9 to 31 of the duty cycle of FIG. 3 when the LCC and CSC signals are high would be ~0.19 W. During the final time slot of the duty cycle of FIG. 3, the instantaneous power loss due to the current sense circuit 106 would be 4.0 W. Therefore, in this case, over the overall duty cycle, the average power loss due to the current sense circuit 106 would be equal to: ~0.26 W. In the case that the LCC signal is high for the entire duty cycle (i.e. the LEDs are on 100% of the duty cycle), the average power loss due to the current sense circuit 106 would be equal to: ~0.31 W (but would be a lower percentage of total power than the previous ~0.26 W case, even though the raw number is higher). In the sample case in which the duty cycle is divided into 256 slots, the CSC signal is low for only one slot and the LCC signal is high for 100% of the 256 slots, the average power loss due to the current sense circuit would be equal to: ~0.20 W. In all of these examples, the average power loss due to the current sense circuit 106 is substantially below the power loss that would result with the use of only the current sense resistor 108.

Although depicted with two current sense control transistors $110_1, 110_2$, it should be understood that there could be only one current sense control transistor or more than two. The number of current sense transistors used depends upon the desired adjustment in resistance within the current sense circuit 106. If only a single current sense control transistor is used, the resistance $R_{CS}$ across the current sense circuit 106 when the CSC signal is high will be higher than the case in which two or more similar transistors are used. Using additional current sense transistors will further reduce the resistance $R_{CS}$ across the current sense circuit 106 when the CSC signal is high, therefore reducing the power loss due to the current sense circuit 106 during this time.

Although a plurality of LEDs 102 is depicted in FIG. 1, it should be understood that the number of LEDs should not limit the scope of the present invention. In particular, the circuit of FIG. 1 could be implemented with one or more LEDs. Further, a plurality of circuits similar to that of FIG. 1 could be implemented within one or more light engine circuits. For instance, each circuit could include a different set of LEDs that are independently controlled by the same or separate LCC signals. This is particularly useful in cases in which the LEDs in each circuit have different aspects, such as color or color temperature. By independently controlling LCC signals for circuits comprising different color/color temperature LEDs, the color/color temperature of the light output from a lighting apparatus can be controlled. The current sense circuit 106 could be implemented within only one of the circuits, a plurality of the circuits or all of the circuits. Further, in some embodiments, the current sense circuit 106 could be shared if two or more of the LED circuits were coupled together at node N1. In this case, the LCC signals of the two or more LED circuits could be activated at different times within the duty cycle and the current sense circuit 106 could be activated (by having the CSC signal turn low) during a time when each of the LED circuits were activated.

Although the current sense circuit 106 of FIG. 1 is coupled between the reference ground and the current control transistor 104, it should be understood that the circuit could be implemented in other variations. For instance, the constant current circuit 106 could be implemented in series between the supply voltage $V_{DD}$ and the LEDs 102. In this case, the current sense transistors $110_1, 110_2$ could be implemented as p-channel transistors, rather than the n-channel transistors depicted in the embodiment of FIG. 1. The calculation of the current using such a design would be slightly more complicated as the voltage drop across the current sense circuit would be equal to the supply voltage $V_{DD}$ minus the voltage at the node between the current sense circuit and the LEDs 102. An apparatus that is to calculate the current flowing through the current sense circuit would therefore need to have knowledge of the current supply voltage $V_{DD}$ in order to accurately calculate the current.

Figure 2A:
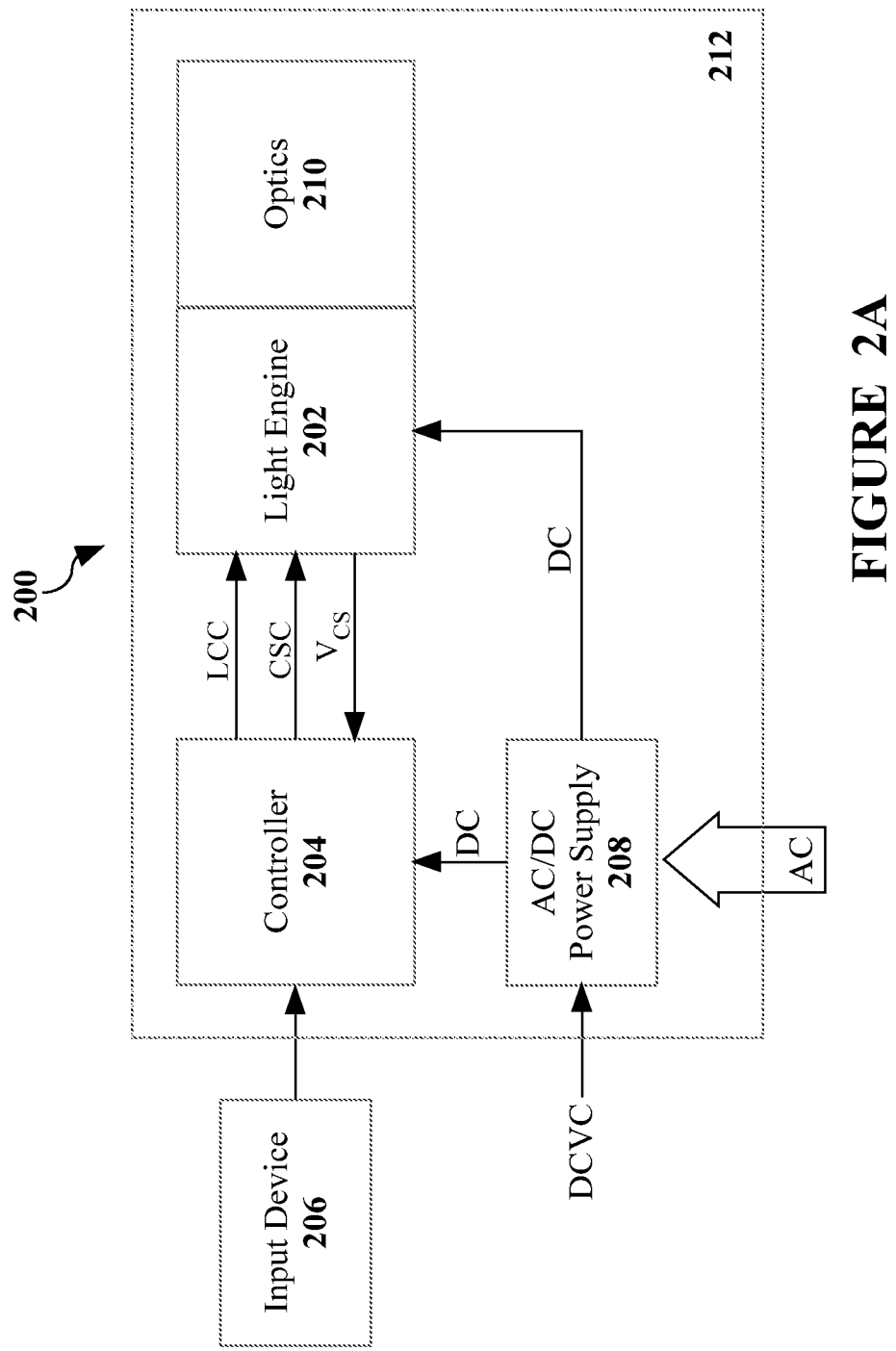
FIGS. 2A, 2B and 2C are logical block diagrams of an LED lighting apparatus according to first, second and third embodiments of the present invention respectively.
Figure 2B:
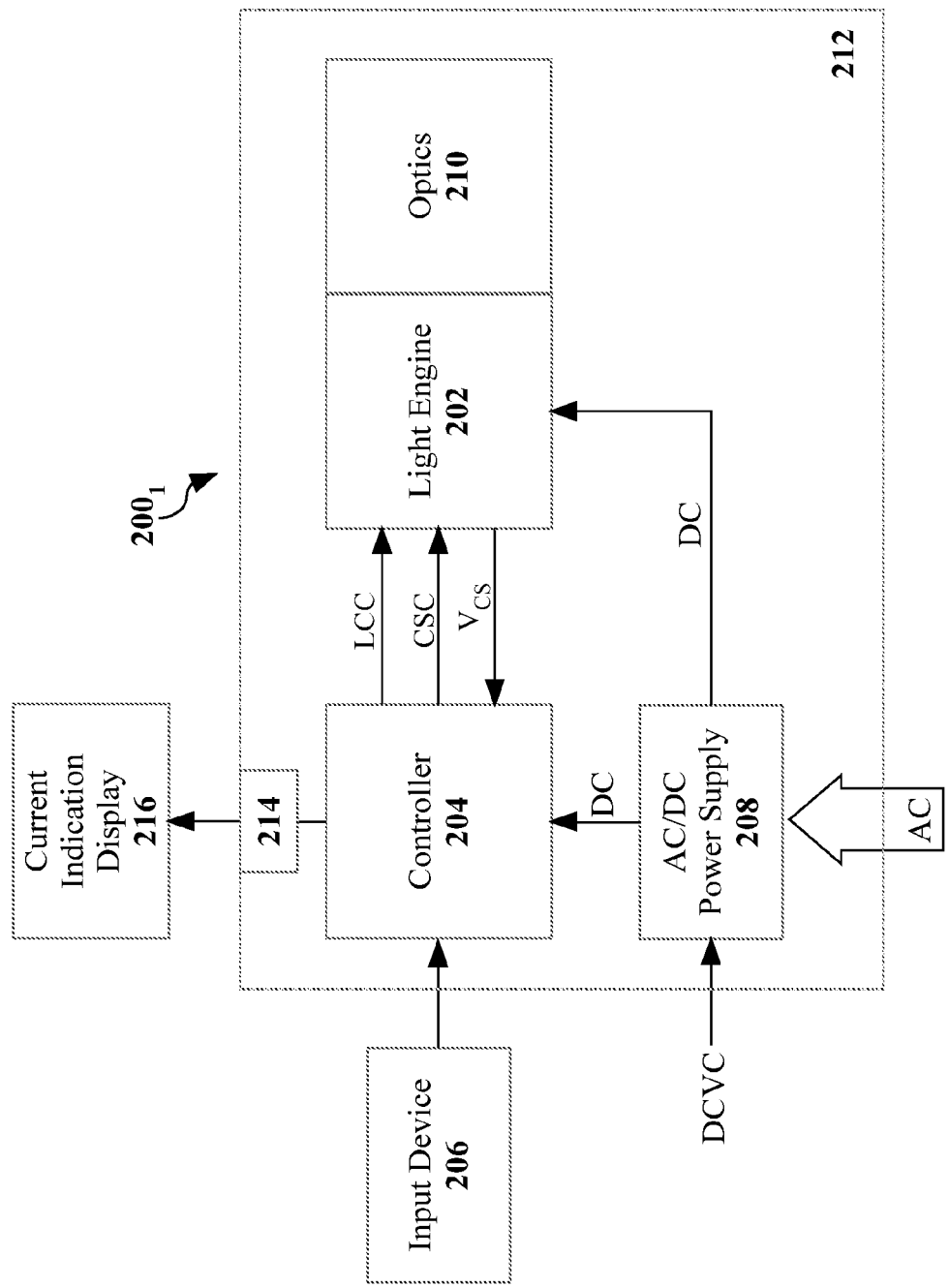
Figure 2C:
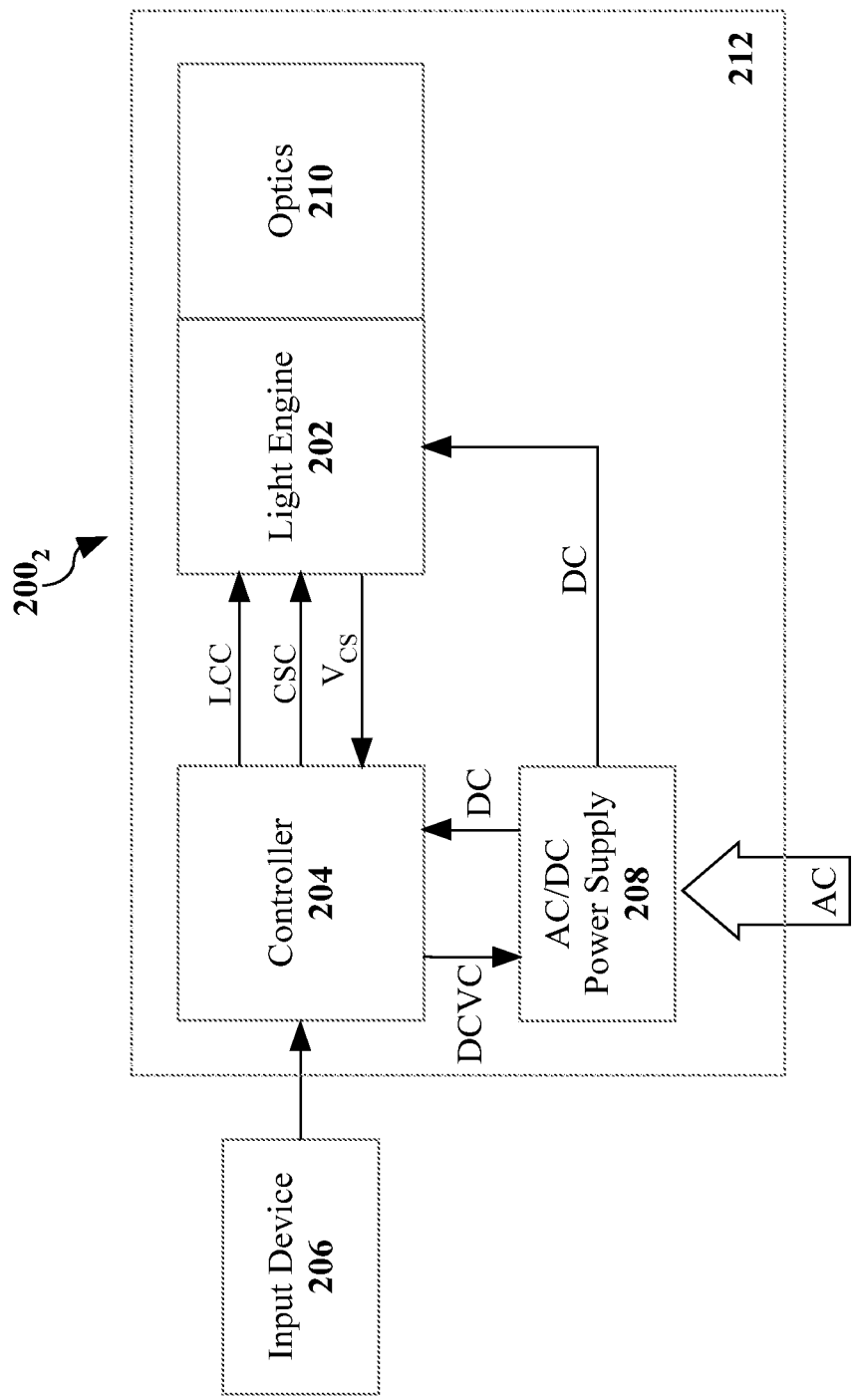

FIGS. 2A, 2B and 2C are logical block diagrams of LED lighting apparatus according to first, second and third embodiments of the present invention respectively. As depicted in FIG. 2A, the LED lighting apparatus 200 comprises a number of distinct components that together enable the lighting apparatus 200 to output light. The LED lighting apparatus 200 comprises a light engine 202 which comprises a circuit with LEDs that emit light when activated, the light engine 202 in some embodiments comprising the circuit of FIG. 1; a controller 204 that outputs control signals (the LCC and CSC signals) to the light engine 202 and detects the current sense voltage $V_{CS}$ on the light engine 202; an input device 206 used by a user of the lighting apparatus 200 to select aspects of the light output such as the intensity, color and/or color temperature; and an AC/DC power supply 208 that receives AC power from the power grid (not shown) and provides DC power to the controller 204 and the light engine 202. As shown in FIG. 2A, the lighting apparatus 200 further comprises an optics element 210 that diffuses the light output from the LEDs. A thermal element (not shown) would also be included within the lighting apparatus 200 to remove heat generated by the LEDs in order to enable them to operate at an acceptable temperature. In this particular embodiment, the lighting apparatus 200 further comprises an encasement 212 that provides protective structure and artistic design to the lighting apparatus 200. In this case, the encasement 212 encases the light engine 202, the controller 204, the AC/DC power supply 208 and the optics element 210.

The light engine 202 according to some embodiments of the present invention is similar to the circuit described herein with reference to FIG. 1. It should be understood that although depicted as a single component in FIG. 2A, the light engine 202 may comprise a plurality of components. For example, the LEDs may be physically separated from non-LED elements. Further, all or some of the elements within the light engine 202 may be integrated within another component such as the controller 204, the encasement 212 or optics element 210.

The controller 204 in FIG. 2A manages the activation of the LEDs within the light engine 202 using the LCC signal (which may comprise one or more signals to one or more circuits within the light engine 202) and, therefore, controls the output light spectrum that is generated by the lighting apparatus 200. In the architecture depicted in FIG. 2A, the controller 204 receives a constant voltage rail and a reference ground from the AC/DC power supply 208 and receives user input signals from the input device 206. The controller 204 interprets the user input signals and may rely on information stored within a local memory (not shown) and internal software or firmware to generate the LCC signal(s) for the light engine 202. Each of the LCC signals, according to some embodiments of the present invention, comprises a pulse signal that may be in an active high state for a set time within a duty cycle.

As one skilled in the art would understand, the controller 204 can take a number of different forms including a microcontroller programmed with software, firmware, an ASIC, an FPGA, a microprocessor, logical hardware components or other components that can generate digital signals. In one particular embodiment, the controller comprises a microprocessor from Microchip Technologies Inc. of Chandler, Ariz., USA.

The input device 206 may comprise a dimmer (ex. a triac dimmer, a 0-10V Lutron dimmer), an infrared remote control, a computer or any other device that can allow a user to make selections concerning aspects of the lighting apparatus 200. The aspects selected may comprise any one or more of the intensity, the color, the color temperature, tint, etc. In some cases, the input device 206 may comprise sensor devices such as an ambient light sensor, a motion sensor and/or an occupancy sensor. In these cases, the sensors may provide input signals to the controller 204 that affect the LCC signal(s) that the controller 204 transmits to the light engine 202. In some embodiments, the input device 206 may be integrated with another component such as the controller 204 or the encasement 212. In other cases, the lighting apparatus 200 may not have an input device 206. For instance, in one embodiment, variations in the aspects of the light output may be controlled by the controller 204 without external inputs using pre-programmed code. The pre-programmed code could be enabled based on an internal clock, a vibration detection sensor, an internal ambient light sensor, an internal motion sensor, an internal occupancy sensor, or another component that may trigger a change in an aspect of the lighting apparatus 200. Further, the pre-programmed code could be set at the factory to calibrate the color temperature/color of the lighting apparatus 200. Yet further, the lighting apparatus 200 in some embodiments comprises an intensity or color sense component and the pre-programmed code can correct for variations in the intensity, color temperature or color, for example variations may occur over time as LEDs may decrease in intensity at different rates over long time periods on the of months or years of operation.

The AC/DC power supply 208 may comprise a large number of different power supply configurations depending upon the particular application. For instance, the AC/DC power supply 208 should be selected to match the power needs of the light engine 202 and the controller 204 and particularly to the LEDs within the light engine 202 which will utilize the majority of the power. The AC/DC power supply 208 of FIG. 2A receives a DC Voltage Control (DCVC) signal that can be used to adjust the DC voltage level applied to the light engine 202 and the controller 204. This adjustment in the DC voltage level may be necessary due to uncertainties with the forward voltages of the LEDs within the light engine 202. In one example, a 24V/20 W power supply may be used in a light engine configuration that activates 7 LEDs in series at a time, each LED having a forward voltage drop of approximately 3.4V in this example. To ensure that a desired current flows through the LEDs within the light engine 202 despite uncertainties within the forward voltage drops of the LEDs, adjustments in the DC voltage level can be made using the DCVC signal as will be described in detail below.

One skilled in the art will understand that the optics element 210 and the thermal element (not shown) can be implemented in many different manners depending on the specific technical requirements of the lighting apparatus 200. The optics element 210, according to some embodiments of the present invention, diffuse the light output from the LEDs such that a single color of light is perceivable at an output of the lighting apparatus 200. In one specific example, the optics element 210 comprises a frosted acrylic plate. The thermal element (not shown) may comprise a heat sink, a heat conductive plate or film, heat conductive fins, one or more heat pipes, a fan, a heat removal diaphragm or other elements that can enable flow of heat away from the LEDs.

It should be understood that the lighting apparatus 200 of FIG. 2A is only a sample lighting architecture that could be used with the present invention and should not be used to limit the scope of the present invention. Large numbers of alternative lighting architectures are understood by one skilled in the art. For instance, the controller 204 could be integrated with any one or more of the light engine 202, the input device 206 and the AC/DC power supply 208. Further, in some lighting architectures, one or more of the components within the lighting apparatus 200 may be removed. For instance, in some lighting architectures the thermal element (not shown) may be removed as passive cooling could be sufficient to remove heat generated by the LEDs or the encasement 212 could act as a thermal element itself.

According to embodiments of the present invention, the controller 204 of FIG. 2A controls the CSC signal that in turn controls the current sense control transistors $110_1, 110_2$ of FIG. 1. By selecting a time (for example, one or more time slots within a duty cycle) to trigger the CSC signal low and therefore turn off the current sense control transistors $110_1$, $110_2$, the controller 204 can decide when to measure the current sense voltage $V_{CS}$. In some embodiments of the present invention, the controller 204 comprises an ADC that is operable to convert the current sense voltage $V_{CS}$ from an analog signal to a digital form. In other embodiments, the ADC is a separate component coupled to the controller 204.

Figure 5A:
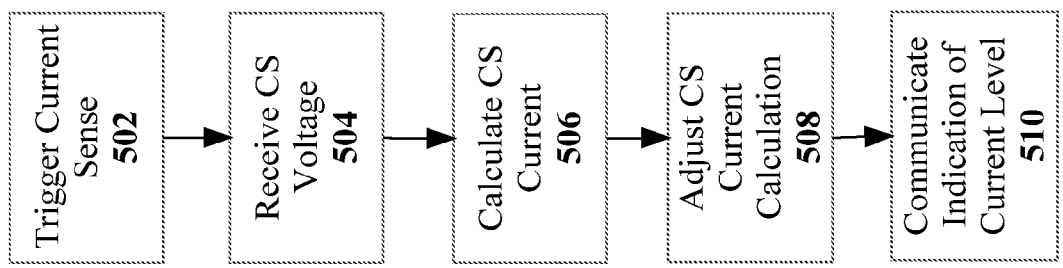
FIGS. 5A and 5B are flow charts illustrating steps of a control algorithm performed by a controller within the LED lighting apparatus of one of FIGS. 2A, 2B and 2C according to two embodiments of the present invention.

FIG. 5A is a flow chart illustrating steps of a control algorithm performed by the controller 204 within the LED lighting apparatus 200 of FIG. 2A according to an embodiment of the present invention. Firstly, as described above, the controller 204 triggers a current sense operation at step 502. A current sense operation can be said to be activated when the controller 204 sets the CSC signal to a low state for a time period (ex. one time slot in a duty cycle) while the LCC signal for the circuit is activated. As discussed, in this state, the resistance $R_{CS}$ across the current sense circuit 106 of FIG. 1 is increased to the resistance of the current sense resistor 108 and the current sense voltage $V_{CS}$ is increased as a result.

The controller 204 subsequently, at step 504, receives the current sense voltage $V_{CS}$. This could be in digital form from an ADC that has converted the analog voltage to a digital form or could be in analog form and the controller 204 performs the conversion. Next, at step 506, the controller 204 calculates the current flowing through the current sense circuit 106 at the time that the current sense voltage $V_{CS}$ was measured. At this time, the resistance $R_{CS}$ across the current sense circuit 106 was equal to the resistance $R_4$ of the current sense resistor 108. By dividing the current sense voltage $V_{CS}$ by the known value of the resistance $R_4$, the controller 204 can calculate the current flowing the current sense circuit 106. This calculated current will correspond to the current flowing through the LEDs 102 during the current sense operation, but may not exactly indicate the current flowing through the LEDs during a normal operation in which the current sense transistors $110_1, 110_2$ are turned on and the resistance $R_{CS}$ across the current sense circuit 106 is significantly reduced. At step 508, the controller 204 may adjust the current calculated at step 506 to compensate for the change in resistance $R_{CS}$ across the current sense circuit 106 during normal operation relative to during current sense operation. In some embodiments, step 508 is not performed and the use of the current calculated at step 506 is utilized by the controller 204.

Next, at step 510, according to some embodiments of the present invention, the controller 204 communicates an indication of the current level calculated in one of steps 506 and 508. This communication can take place in a number of manners and, as will be described herein with reference to FIG. 2A, will be directed to a user that can adjust the DCVC signal that controls the DC voltage level applied to the light engine 202. In the embodiment of FIG. 2A, the controller 204 communicates an indication of the current level to a user through adjustments in the light output from the lighting apparatus 200.

In one particular implementation, the controller 204 determines whether the current level calculated is within an acceptable range of values for the current flowing through the LEDs within the light engine 202. If the current level calculated is not within the acceptable range of values, the controller 204 may control the LCC signal to go to a low state for all or substantially all of the time within a duty cycle and therefore effectively turn off the light output from the light engine 202. By doing this, a user can detect this information and interpret it as an indication of the current level. In response, the user can adjust the DCVC signal to correct the DC voltage level output from the AC/DC power supply 208. For instance, the controller 204 may only turn off the light output from the light engine 202 if the current level calculated is above a maximum acceptable level. By doing this, the controller 204 can protect the LEDs within the light engine 202 from excess current issues. The controller 204 can continually check the current level within the light engine 202 even after turning the light output off by selectively turning the LCC signal to a high state and the CSC signal to a low state for a short time period (for example one time slot out of 256 time slots) in each duty cycle or a plurality of duty cycles (ex. one time slot every second). In this example, once the user has adjusted the DCVC signal so that the DC voltage level applied as the supply voltage $V_{DD}$ is lowered to the point where the current level calculated by the controller 204 is below the maximum acceptable level, the controller 204 can control the LCC signal(s) as normal and allow a normal operation for the light output from the lighting apparatus 200 to continue.

In a second implementation, the controller 204 can communicate an indication of the current level in a different manner. For instance, in some embodiments, the controller 204 may control the LCC signal(s) in order to create a visible blinking in the light output from the lighting apparatus 200. The actual value of the current level calculated or an indication of the current level as it relates to an acceptable range of values, can be communicated using a series of flashes that may be of consistent length or alternatively be of different time length (ex. a set of short and long flashes that communicate information using a protocol such as Morse Code). In another variant, the controller 204 may cause the light output from the lighting apparatus to blink if the current level calculated is outside of the acceptable range for the light engine, the length of the blinks indicating to a user the difference between the current level calculated and the acceptable range of currents. For example, as the user adjusts the DCVC signal to move the DC voltage level applied to the light engine 202 towards the correct level, the blinks may decrease in length to indicate that the current level calculated is getting closer to the acceptable range. It should be understood that other techniques to communicate an indication of the current level calculated are possible using adjustments in the light output from the lighting apparatus 200.

In yet another implementation, the controller 204 can communicate an indication of the current level using changes in the light output from the lighting apparatus 200 that are not visible to the human eye. In order to accomplish this, the controller 204 may utilize a number of different modulation techniques including pulse position modulation, frequency modulation or pulse width modulation to generate the LCC signal(s) that in turn control the light output of the lighting apparatus 200. For example, the controller 204 may transmit digital information related to the current level calculated by adjusting the duty cycle utilized or by slightly adjusting the on/off time of the LEDs from duty cycle to duty cycle. The light output from the lighting apparatus 200 can then subsequently be received and interpreted by a separate apparatus as will be described with reference to FIGS. 4A and 4B.

FIGS. 4A and 4B are logical block diagrams of a current level display apparatus according to particular example implementations of the present invention in which the LED lighting apparatus of FIG. 2A communicates information optically. The current level display apparatus of FIG. 4A comprises an optical receiver 402, a controller 404 and a display 406. The optical receiver 402 receives the light output from the lighting apparatus 200 and provides an indication of the light levels to the controller 404 which can then interpret the light levels in order to extract the information related to the indication of the current level. The interpretation techniques used will depend upon the modulation techniques used within the controller 204. It should be understood that the optical receiver 402 and the controller 404 work together to regenerate the indication of the current level being transmitted by the controller 204 through the light output of the lighting apparatus 200. Once the indication of the current level has been regenerated, the controller 404 transmits it to the display 406 so that it can be displayed to a user. The user can read the display 406 and based upon the indication of the current level (which may be a number or another indication (ex. color, shape, arrow, etc.), the user can adjust the DCVC signal within the AC/DC power supply 208 in order to adjust the DC supply voltage $V_{DD}$ applied to the light engine 202.

FIG. 4B depicts a slightly modified version of the current level display apparatus of FIG. 4A. In the FIG. 4B, the display 406 is replaced with first, second and third sets of LEDs 408,410,412. In one implementation, the first, second and third sets of LEDs 408,410,412 comprise green LEDs, yellow LEDs and red LEDs respectively. In this embodiment, the controller 404 is operable to turn on one or more of the sets of LEDs 408,410,412 based upon the received indication of the current level. For example, if the current level is within an acceptable range, the green LEDs 408 may be turned on while, if the current level is in at a critical level, the red LEDs 412 may be turned on. In other cases, in which the current level is not ideal, the yellow LEDs 410 may be turned on. The LEDs 408,410,412 may be used to provide information and/or instructions to a user in order to trigger an adjustment in the DCVC signal for the AC/DC power supply 208.

It should be noted that the adjustment of the DCVC signal could be accomplished in a number of manners depending upon the particular implementation within the AC/DC power supply 208. In some example implementations, an adjustment in the DCVC signal is triggered by a mechanical adjustment in an element such as a screw, dial, dimmer or other input device. In other implementations, the DCVC signal may be controlled electronically. In embodiments of the present invention related to FIG. 2A, a human will view the indication of the current level in some form as described and manually adjust the voltage of the AC/DC power supply 208, though it should be understood that in other embodiments, such a voltage adjustment is done automatically.

FIG. 2B is a modified logical block diagram to that depicted in FIG. 2A. The lighting apparatus $200_1$ of FIG. 2B is similar to that of FIG. 2A and therefore similar elements have been labeled with the same references. In FIG. 2B, the lighting apparatus $200_1$ further comprises a terminal 214 which is coupled to a current indication display 216. In this embodiment, rather than communicate an indication of the current level through control of the LCC signal(s) and therefore the light output of the lighting apparatus, the controller 204 communicates an indication of the current level calculated to the current indication display 216 directly through the terminal 214. This communication could take many forms and the indication of the current level may be transmitted in analog or digital form, may be modulated or not and may be encapsulated within a protocol system (ex. packet based protocol such as Internet Protocol). The current indication display 216 can operate in much the same manner as either the apparatus of FIG. 4A or 4B but there will be no need for the optical receiver 402.

FIG. 2C is a further modified logical block diagram to that depicted in FIG. 2A. The lighting apparatus $200_2$ of FIG. 2C is similar to that of FIG. 2A and therefore similar elements have been labeled with the same references. In FIG. 2C, the controller 204 does not communicate the indication of the current level to a user so that the user can adjust the DC voltage level output from the AC/DC power supply 208. Instead, in FIG. 2C, the controller 204 directly controls the AC/DC power supply 208 using the DCVC signal. In this embodiment, the controller 204 will operate with a modified control algorithm to that described with reference to FIG. 5A for the lighting apparatus 200 of FIG. 2A.

Figure 5B:
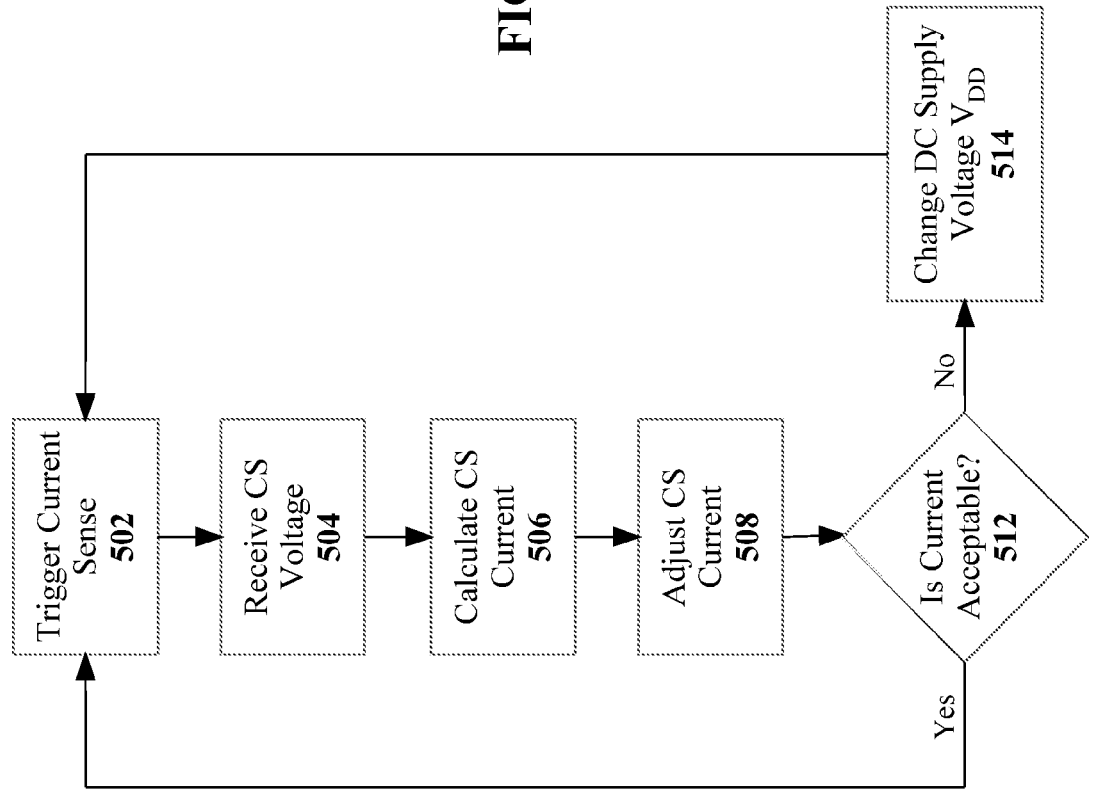

FIG. 5B is a flow chart illustrating steps of a control algorithm performed by a controller within the LED lighting apparatus $200_2$ of FIG. 2C according to an embodiment of the present invention. The control algorithm of FIG. 5B is similar to that of FIG. 5A and therefore similar elements have been labeled with the same references. As depicted in FIG. 5B, rather than step 510, the controller 204 within the lighting apparatus $200_2$ determines at step 512 whether the current level calculated within step 508 (or 506 if step 508 is not performed) is acceptable. This can be done by a number of manners. For example, an acceptable range may be programmed within the controller 204 and the controller 204 may compare the current level calculated with the acceptable range. In other examples, the controller 204 may have an exact value that is desired for the current level within the light engine and the controller 204 may only determine that the current level calculated is acceptable if the current is precisely at the value desired.

As shown, if the current level calculated is not acceptable at step 512, the controller 204 adjusts the DC supply voltage $V_{DD}$ output from the AC/DC power supply 208 by adjusting the DCVC signal. This adjustment may be precisely calculated to result in a current level within the light engine 202 that will be acceptable or alternatively may be an adjustment in the direction towards the current level becoming acceptable. In particular, the controller 204 may determine the level of the adjustment by the difference between the current level calculated and the acceptable range of current levels (or the exact value that is desired). After the adjustment at step 514, the controller 204 may continue to monitor the current level by returning to step 502 and repeating the steps of FIG. 5B. If the current level calculated is acceptable at step 512, the controller 204 may also continue to monitor the current level by returning to step 502 and repeating the steps of FIG. 5B. Alternatively, once the current level calculated is acceptable at step 512, the controller 204 may stop monitoring the current level for a set time period or possibly forever.

Although the embodiments of FIGS. 2A, 2B and 2C are described as independent embodiments of the present invention, it should be understood that two or more of the embodiments could be implemented within a single lighting apparatus. For instance, the automatic control system described above with reference to FIG. 2C could be implemented along with a communication system such as that described with reference to FIG. 2A or 2B. The use of the communication system of an indication of the current level may be desirable to provide back-up information, to provide a person the actual value for the current level and/or to provide an emergency shut-off of the LEDs in the case that the current flowing through the LEDs is above a maximum acceptable level.

Although described as time slots within a duty cycle, it should be understood that the divisions within a duty cycle may be in any segments. For instance, in some embodiments of the present invention, the duty cycle is divided into time segments in μ seconds. In other embodiments, the duty cycle is divided into time slots (ex. 256) but the actual number of time slots assigned to a particular operational state may not be an integer. In these cases, the exact selection of the number of time slots may be set by an average of the number of time slots across a plurality of duty cycles.

Figure 6:
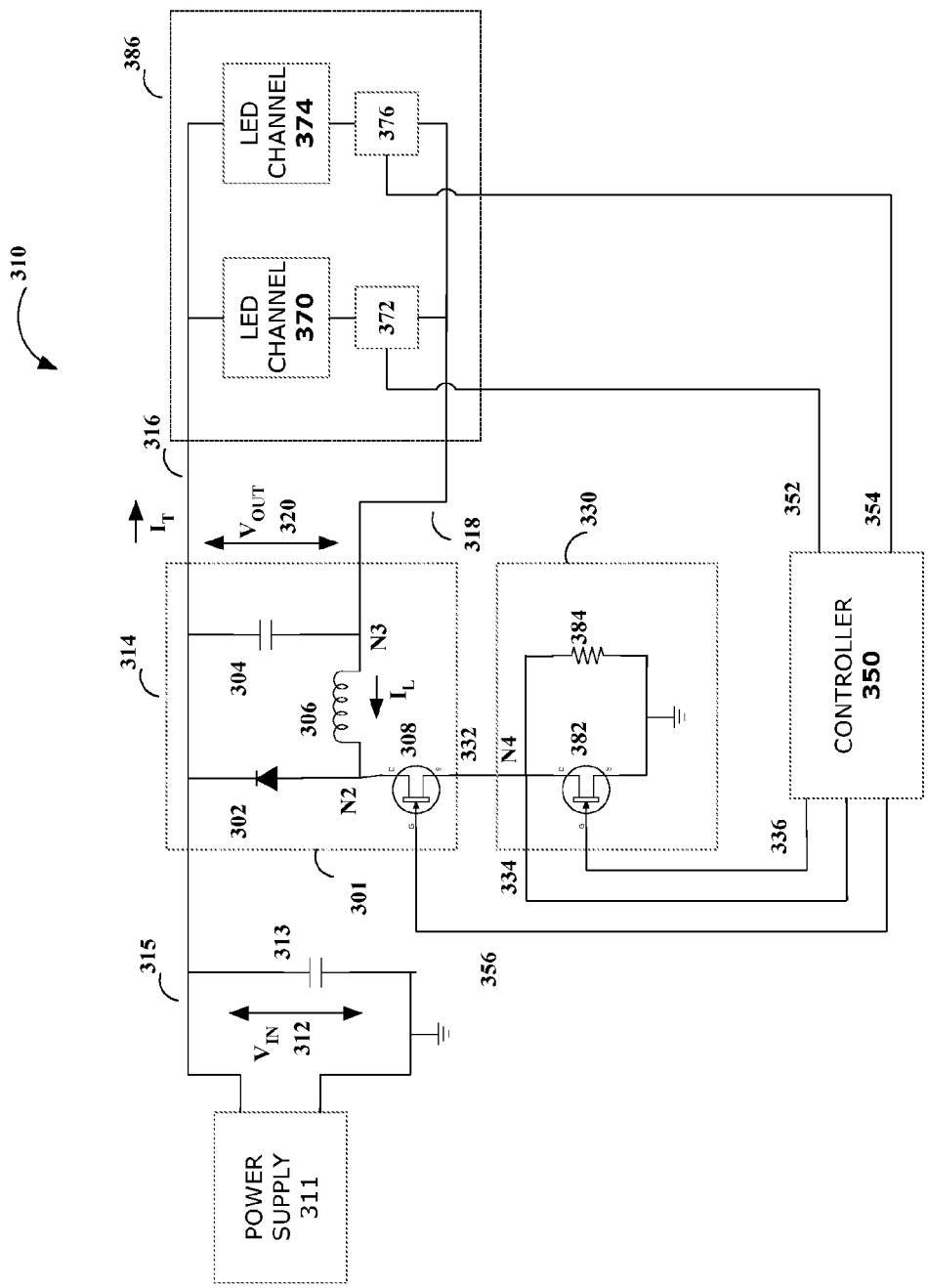
FIG. 6 is a schematic diagram of another embodiment of the invention comprising a voltage converter.

Another embodiment of the invention may comprise a power supply 311 to supply power to light engine 386 and controller 350 as illustrated in FIG. 6. Power supply 311 may be a constant voltage power supply operable to provide a fixed output voltage, for example 24V DC. Power supply 311 may have an output coupled to voltage converter 314 to supply voltage converter 314 with a positive supply voltage 315. Voltage converter 314 may be operable to increase or decrease the voltage provided by power supply 311 to provide an output voltage 320 to light engine 386 or at least one LED channel, for example LED channels 370 and 374. The output voltage 320 may be set by controller 350 by setting voltage control signal 356 appropriately so that an appropriate voltage is applied to the LEDs, for example, LED channels 370 and 374. The controller 350 may also use current sense circuit 330 to estimate the current through the light engine 386 or the plurality of LED channels and use this information to set voltage control signal 356 appropriately as part of a feedback control system. Controller 350 as used herein should be understood broadly to be any type of electronic control apparatus including, for example, a microcontroller, ASIC, FPGA, etc. or another type of device. Controller 350 may also be may be considered one type of a current determination apparatus.

One or more LED channels, for example, LED channels 370 and 374 may be coupled between high voltage rail 16 and low voltage rail 18. LED channels 70 and 74 may be comprised of at least one LED or a plurality of LEDs in a number of different configurations, for example, a plurality of LEDs connected in series. In the configuration shown, the high voltage rail 16 and low voltage rail 18 may be common to all LED channels of lighting apparatus 310 so that the voltage drop across each LED channel is approximately the same and only a single voltage converter 314 is required in certain embodiments.

Additionally, having a common high voltage rail 316 and low voltage rail 318 may increase the modularity of the invention compared to known prior art. For example, having a high voltage rail 316 and/or common low voltage rail 318 may allow a single voltage converter 314 and/or controller 350 to be used with multiple light engines (including light engines implemented on different boards) that may be coupled together so that the invention may be readily adapted to a variety of situations. For example, the invention may be adapted to be used with a modular architecture, such as, that disclosed in "Modular LED Strip Lighting Apparatus" filed as U.S. Provisional Patent Application No. 61/467,914 on Mar. 25, 2011 by Briggs, which is hereby incorporated by reference.

Switching elements 372 and 376 may also be coupled in series with LED channels 370 and 374, respectively, between the high voltage rail 316 and low voltage rail 318. Switching elements 372 and 376 may also be coupled to controller 350 to receive channel control signals 352 and 354. Switching element 372 may function as a switch under the control of channel control signal 352 provided by the controller 350 so that switching element 372 is opened and closed within a cycle (i.e. pulse width modulated) to selectively allow a current to flow through LED channel 370. Switching element 372 may be considered a light control transistor associated with LED channel 370 in certain implementations. For example, switching element 372 may be implemented as an n-channel MOSFET having its gate coupled to channel control signal 352 and other control circuitry (e.g. a voltage divider) in certain implementations. Switching element 372 and channel control signal 352 may operate so that LED channel 370 is operated in a PWM manner with the intensity of the light output being dependent upon the duty cycle of the channel control signal 352. More specifically, the duty cycle of channel control signal 352 may determine the average current permitted to flow through LED channel 370 and therefore determine the average intensity of light output from LED channel 370. The frequency of channel control frequency 352 should be chosen to be compatible with the specific LEDs used and so that no perceivable flicker is apparent as a result of the pulse width modulation. For example, channel control signal 352 may be chosen to be 1 KHz in certain embodiments, although other frequencies may also be used. Similarly, switching element 376 may operate under the control of channel control signal 354 to cause LED channel 374 to be pulse-width modulated to control the intensity of light emitted by LED channel 374. Switching element 376 may also be considered to be a light control transistor associated with LED channel 374 in certain implementations.

In certain embodiments, LED channel 370 may comprise at least a subset of LEDs having a first colour or colour temperature. LED channel 374 may comprise at least a subset of LEDs having a second colour or colour temperature, the second colour or colour temperature being different than the first colour or colour temperature. By setting the duty cycle of channel control signals 352 and 354 the controller 350 may set the relative intensity of the light radiated from LED channels 370 and 374 to set the colour or colour temperature of the light emitted from the lighting apparatus 310.

An input voltage 312 may be received at the input to voltage converter 314 and defined between positive supply 315 and a reference ground. An input capacitor 313 may be coupled between positive supply 315 and a reference ground before the positive supply 315 is coupled to voltage converter 314. The input capacitor 313 may function to mitigate against current spikes caused by voltage converter 314 and reinforce the output capacitance of power supply 311 to assist in supplying the required current to voltage converter 314. In the embodiment shown in FIG. 6, voltage converter 314 may be implemented as buck converter 301. Buck converters are known in the art and are a form of DC-DC voltage converters that operate to provide an output voltage that is lower than an input voltage to the buck converter. In other embodiments, other types of voltage converters may be used with suitable modification, for example, a boost converter which functions to provide an increased output voltage relative to the input voltage.

The buck converter 301, acting as voltage converter 314, in FIG. 6 may operate to increase the voltage on low voltage rail 318 to therefore reduce output voltage 320, which is defined between the high voltage rail 316 and low voltage rail 318. With suitable modification, a buck converter may also be employed to reduce output voltage 320 by reducing the voltage applied to high voltage rail 316 as described below with reference to FIG. 8. Buck converter 301 may comprise a diode 302 coupled between high voltage rail 316 and node N2, with diode 302 being biased to permit a current to flow from node N2 to high voltage rail 316. The diode may be a fast diode having a high current rating and high reverse breakdown voltage, for example, a schottky or super-fast diode. A capacitor 304 may be coupled between high voltage rail 16 and node N3. The capacitor may be, for example, a 1000 uF (microfarad) capacitor. An inductor 306, for example having an inductance of 33 uH (33 microhenry), may be coupled between nodes N2 and N3. More generally, inductor 306 should be chosen to store sufficient energy to maintain an adequate current when buck converter 301 is in a state where inductor 306 is being discharged. Additionally, a switching element, for example MOSFET 308 may be coupled between nodes N2 and N4. The gate of MOSFET 308 may be coupled to receive voltage control signal 356 from controller 350 so that MOSFET 308 may allow a current to flow from nodes N2 to N4 (drain to source) when the MOSFET is activated by voltage control signal 356 and prevent a current from flowing when the MOSFET is inactivated by voltage control signal 356.

Voltage control signal 356 may be a PWM signal having a duty cycle that may cause MOSFET 308, or more generally a switching element, to selectively allow a current to flow. When voltage control signal 356 is switched so that MOSFET 308 is in an active state and allows a current to flow (e.g. control signal 356 is switched from low to high where the MOSFET is an n-channel MOSFET) the instantaneous voltage across inductor 306 between nodes N3 and N2 is increased. In this state, the inductor current $I_L$ gradually increases as the inductor charges which also results in a corresponding decrease in the voltage across the inductor 306 over time. As a result of the voltage across inductor 306, the voltage on the low voltage rail 318 is increased which results in a decreased output voltage 320.

After a period of time, the voltage control signal 356 may be set so that MOSFET 308 is switched from an active state allowing a current to flow to an inactive state preventing a current from flowing (e.g. switch the control signal from high to low where the MOSFET is an n-channel MOSFET). When MOSFET 308 is inactivated, the voltage across the inductor 306 from node N3 to N2 reverses polarity. As a result of the voltage decrease across inductor 306, the diode 302 is activated and a current may flow through the diode 302 to LED channels 370 and 374 as current is discharged from inductor 306. The voltage control signal 356 may then be set to again activate MOSFET 308 to allow a current to flow and change the state of the buck converter 301 in a periodic manner. Voltage control signal 356 may be a PWM signal having a period of 50 kHz in certain embodiments, although other frequencies are possible, to allow buck converter 301 to output a relatively constant DC output voltage 320 notwithstanding that the control signal 356 is causing the buck converter 301 to alternate operational states. The duty cycle or frequency of voltage control signal 356 may be varied to vary the output voltage 320 from voltage converter 314. Capacitor 304 may also assist in providing a relatively smooth DC output voltage 320 by smoothing any ripple in the output voltage 320 as the capacitor charges and discharges.

Current sense circuit 330 may be coupled between node N4 and a reference ground to receive sense current 332 from buck converter 301. Current sense circuit 330 may comprise a switching element 382, which may be a MOSFET, coupled in parallel with a resistor 384 between node N4 and a reference ground. Current sense control signal 336 may be coupled between switching element 382 and controller 350 so that switching element 382 may be controlled by controller 350. For example, current sense control signal 336 may be coupled to the gate of an n-channel MOSFET so that the MOSFET allows a current to flow when provided with a high value of control signal 336 (i.e. the MOSFET is active) and prevents a current from flowing when provided with a low value of control signal 336 (i.e. the MOSFET is inactive). Although only a single switching element is depicted in the current sense circuit 330, two or more switching elements may be coupled in parallel with resistor 384 in certain embodiments to further decrease the resistance of current sense circuit 330 when the switching elements are activated. For example, the circuit sense circuit illustrated in FIG. 1 and described previously may be adapted for use with the embodiment shown in FIG. 6.

Controller 350 may cause switching element 382 to be activated to allow a current to flow through it when the controller 350 is not sampling the current sense voltage 334, which may be considered the voltage at node N4. Activating switching element 382 decreases the combined resistance of the switching element 382 and resistor 384, since they are in parallel and may increase the efficiency of the lighting apparatus as described previously with reference to FIG. 1. Before sampling the current sense voltage 334, controller 350 may deactivate switching element 382 so the resistance of the current sense module 330 is approximately the resistance of resistor 384. The current sense voltage 334 may be sampled for a relatively small time period before switching element 382 is activated again resulting in a lower amount of power dissipated in the current sense module 330 because of the reduced average resistance. Similarly, the accuracy of the current sense module 330 may be increased by allowing a resistor 384 having a larger resistance to be used increasing the current sense voltage 334 for a given current to possibly increase the signal to noise ratio and use more of the dynamic range of an analog-to-digital (ADC) converter. In this manner, controller 350 may function as one type of current determination apparatus, although other types of current determination apparatus may also be used without departing from the scope of the invention.

When sampling the current sense voltage 334, controller 350 may employ an ADC converter to obtain a digital representation of the current sense voltage 334. This data may then be used directly or used to calculate the sense current 332 flowing through current sense module 330 by dividing the measured voltage by the resistance of the current sense module 330 when the switching element 382 is inactive and the current is sampled. Generally, data related to the current sense voltage 334 may be used by controller 350 and may be considered to include the current sense voltage 334 itself, an estimate of the sense current 332, an average of the current sense voltage 334, an estimate of the average sense current 332, etc. It should be noted that controller 350 may use either the current sense voltage 334 or sense current 332 when setting the voltage control signal 356 and other control signals without departing from the scope of the invention.

Figure 7:
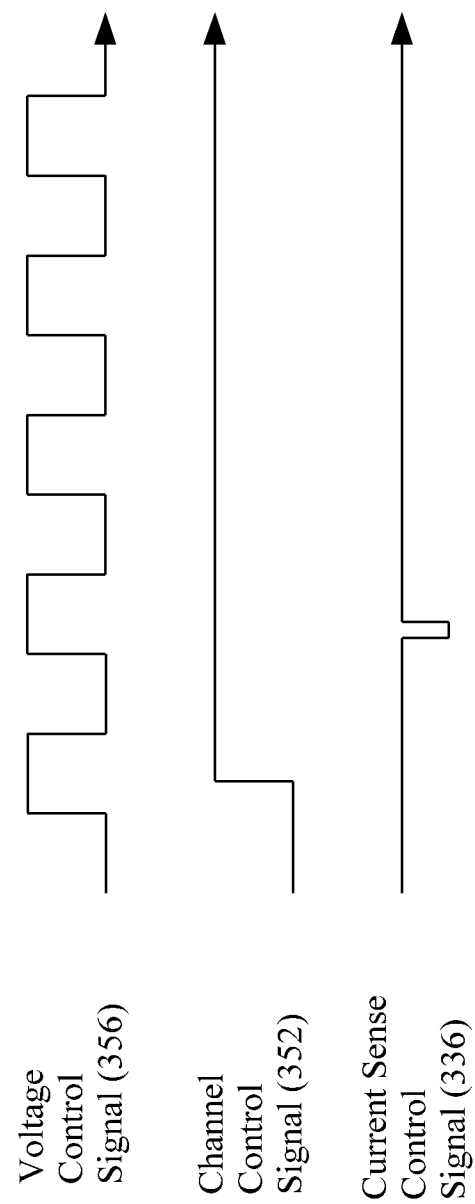
FIG. 7 is a timing diagram illustrating the relative timing of various control signals in one possible implementation of the embodiment shown in FIG. 6.

Controller 350 may also set current sense control signal 336 and voltage control signal 356 to ensure that current sense control signal 336 is only activated when current is flowing through current sense module 330 to ensure an accurate reading. A timing diagram illustrating one possible relationship between current sense control signal 336 and voltage control signal 356 to ensure an accurate measurement of the sense current 332 (or more generally data related to the current sense voltage 334) is illustrated in FIG. 7. Current sense control signal 336 may be maintained high so that switching element 382 is activated when the current sense voltage 334 is not being sampled. The current sense voltage 334 may only be sampled when voltage control signal 356 is high to allow a current to flow through switching element 308 into the current sense module 330 to ensure that a representative sample of current sense voltage 334 is obtained. In embodiments where a single LED channel is coupled between high voltage rail 316 and low voltage rail 318, for example LED channel 370, the current sense voltage 334 may be sampled when channel control signal 352 is set to allow a current to flow through LED channel 370 and voltage control signal 356 is set to allow sense current 332 to flow to current sense circuit 330.

It is also important to account for the impact of channel control signals 352 and 354 that provide PWM signals to activate switching elements 372 and 376 to selectively allow a current to flow through LED channels 370 and 374. To obtain an accurate estimate of the average sense current 332, current sense voltage 334 may be sampled a number of times and then averaged so that the instantaneous current variations through LED channels 370 and 374 caused by the PWM channel control signals 352 and 354 do not result in an erroneous measurement. For example, current sense voltage 334 may be sampled 256 times a second to generate a sample set of current sense voltage measurements that may be averaged to obtain an estimate of the current sense voltage 334. The average current sense voltage 334 may subsequently be used directly by controller 350 or used to calculate an average of the sense current 332 by controller 350. Data related to the current sense voltage 334, such at the current sense voltage 334 or sense current 332, may then be used to set the voltage control signals 356 (i.e. the duty cycle) to adjust the output voltage 320 going forward as part of a feedback control system. It should be noted that in certain embodiments, the output voltage is expected to undergo gradual changes as part of the feedback control system so taking a number of measurements of the current sense voltage 334 and averaging these measurements to increase accuracy may increase the overall effectiveness of the control system.

In certain embodiments, current sense voltage 334 may be sampled without knowledge of the timing or phase of channel control signals 352 and 354. A lookup table may then be used to obtain a more accurate estimation of the average current sense voltage 334 or sense current 332 based on the particular characteristics of the embodiment. For example, in certain embodiments, the current may be slightly higher shortly after the switching elements 372 and 376 have been activated to allow a current to flow. In this case, the measured current sense voltage 334 may be adjusted based on values stored in a lookup table to obtain a more accurate estimate of the current sense voltage 334. Similarly, a slightly lower current could be adjusted for when sampling some time after switching element 372 and 376 have been activated.

Additionally, current sense control signal 336 may be set to ensure that the current sense voltage 334 is only sampled when in a relatively steady state to minimize the impact of transient variations in the sense current 332 in certain embodiments. This may be accomplished by activating control signal 336 some time after a transition in voltage control signal 356 causes buck converter 301 to change state to increase accuracy. For example, as shown in FIG. 7 the current sense control signal 336 transitions from high to low, where a measurement is taken, some time after the transition of voltage control signal 356.

Based at least partially on data related to the current sense voltage, such as, the current sense voltage 334 or estimated sense current 332, controller 350 may set the duty cycle of voltage control signal 356 to set the output voltage 320 from voltage converter 314 to achieve a desired result. For example, the duty cycle of the voltage control signal 356 may be adjusted to achieve a desired intensity of light output set by input device 206. Similarly, in certain other embodiments, the duty cycle may be set to achieve a desired colour or colour temperature of light output. More specifically, the duty cycle of voltage control signal 356 may be reduced by controller 350 to cause a corresponding reduction in output voltage 320 from buck converter 301. As a result of the reduced output voltage 320, the total current $I_T$ passing through LED channels 370 and 374 will be reduced, causing a reduction in light output from both LED channels 370 and 374 and therefore the lighting apparatus 310. Similarly, the controller 350 may increase the duty cycle of control signal 356 to cause a corresponding increase in the output voltage 320 to increase the total current passing $I_T$ through LED channels 370 and 374 to increase the intensity of light output from same. In this manner, the intensity of the light output from lighting apparatus 310 may be controlled to permit dimming using a constant voltage power supply 311 having a fixed output voltage without applying a PWM signal to each LED channel or the LED channels collectively. Instead, the current flowing through the LED channel(s) may be controlled by modifying the output voltage 320 from the voltage converter 314.

Figure 8:
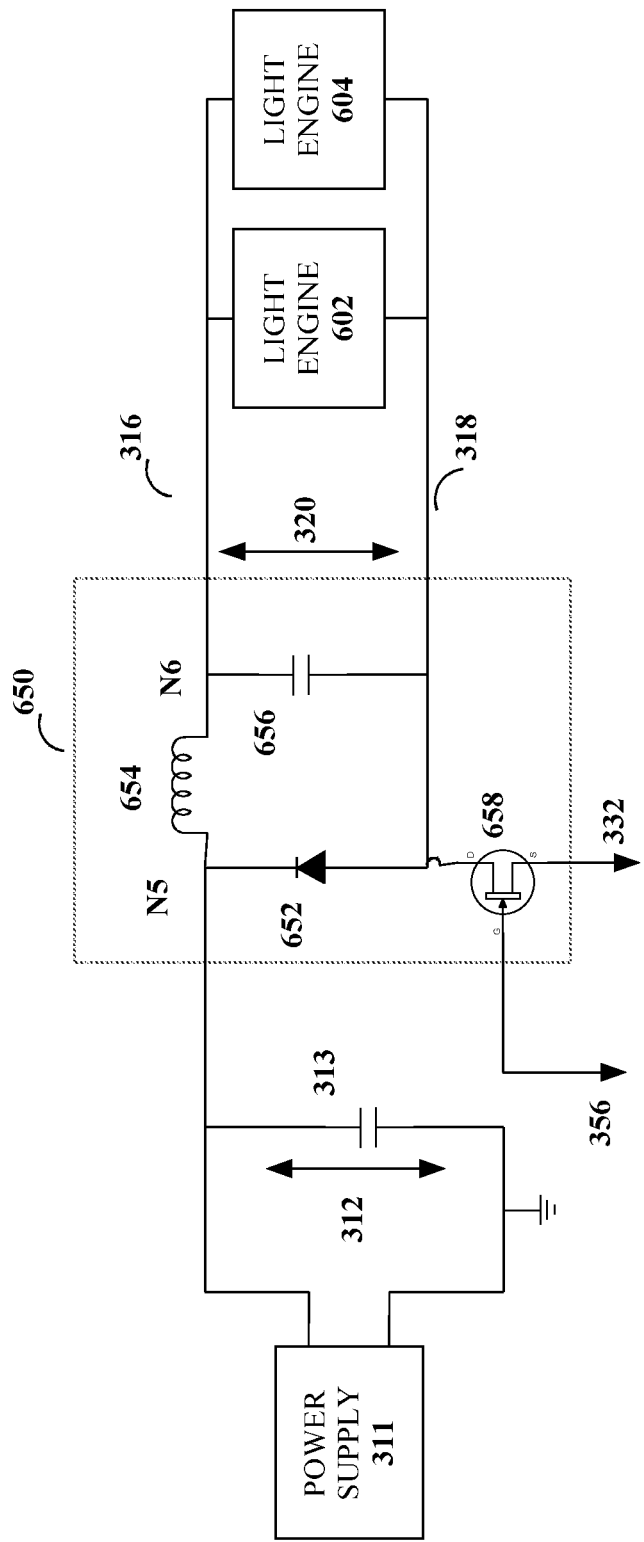
FIG. 8 is a schematic diagram of a further embodiment of the invention comprising a voltage converter.

Voltage converter 314 may be implemented in a number of different configurations, for example, buck converter 650 as illustrated in FIG. 8. Buck converter 650 may be substituted for buck converter 301, acting as a voltage converter 314, as depicted in FIG. 6 with suitable modification. In the embodiment shown in FIG. 8, buck converter 650 may be coupled to light engines 602 and 604 via high voltage rail 316 and low voltage rail 318, which may be coupled to both light engines 602 and 604. Light engines 602 and 604 may be implemented on different physical circuit boards and each contain a plurality of LEDs and terminals (not shown) to facilitate coupling between high voltage rail 316 and low voltage rail 318 and to controller 350. Such a configuration may permit a modular approach that may allow one or more light engines to be coupled to the output of a voltage converter so that a single voltage converter 314, power supply 311, current sense circuit 330, and controller 350 may operate with a variable number of light engines. Alternatively, in certain configurations the single voltage converter 314, power supply 311, current sense circuit 330, and controller 350, and at least one LED channel may be implemented on a single board and other light engines comprising a plurality of LEDs without these control components may be coupled to this board (light engine). Other configurations are possible in other embodiments and the various component elements may be implemented on the same or different circuit boards without departing from the scope of the invention.

As shown in FIG. 8, buck converter 650 may be coupled to power supply 311 to receive input voltage 312. A diode 652 may be coupled between node N5 and low voltage rail 318 and biased to allow a current to flow from low voltage rail 318 to node N5. Inductor 654 may be coupled between nodes N5 and N6 and a capacitor may be coupled between node N6 and low voltage rail 318 as shown. A switching element 658, for example an n-channel MOSFET, may be coupled between low voltage rail 318 and a connection to provide a sense current 332 to current sense circuit 330 or a reference ground. Switching element 658 may be controlled via voltage control signal 356 provided by controller 350 in a similar manner to that previously described.

When switching element 658 is activated, from a previously inactive state, to allow a current to flow through it, a positive instantaneous voltage is created across inductor 654 between nodes N5 and N6 which causes the output voltage 320 to be reduced by reducing the voltage applied to high voltage rail 316 at the output of buck converter 650 and therefore reducing the output voltage 320 applied to the LEDs (for example, the LED channels in certain embodiments). In this state, inductor 654 is charging. Conversely, when switching element 658 is set to an inactive state from a previously active state, a negative instantaneous voltage is created across the inductor 654 between nodes N5 and N6, which may cause diode 652 to conduct a current and discharge inductor 654. Where voltage control signal 356 is operated as a PWM signal the voltage applied to the high voltage rail 316 and hence the output voltage 320 may be reduced relative to input voltage 312 in a manner known to persons skilled in the art. A lighting apparatus incorporating buck converter 650 may otherwise be operated in an analogous manner to that previously described with reference to buck converter 301.

Figure 9:
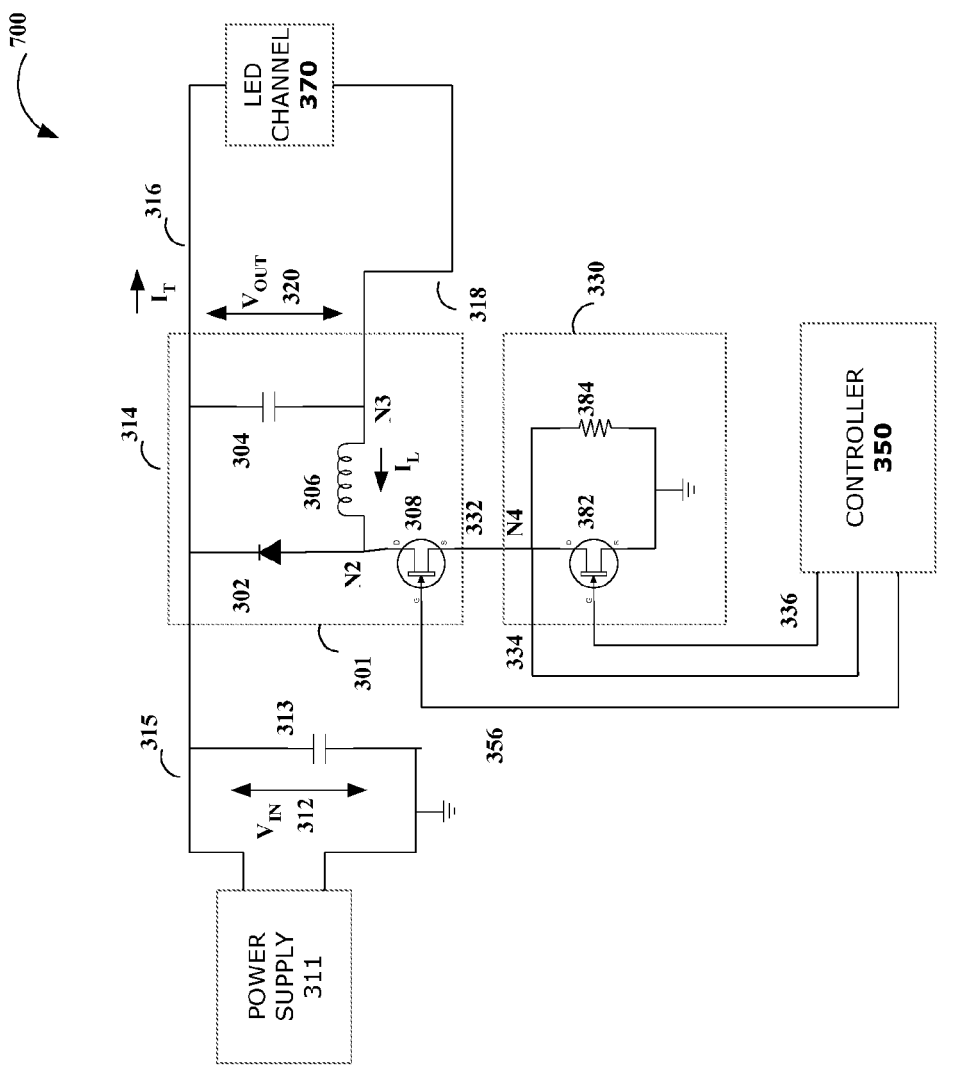
FIG. 9 is a schematic diagram of a further embodiment of the invention wherein the LED channel does not include separate circuitry to apply a pulse width modulated signal to a LED channel.

In certain embodiments, such as lighting apparatus 700 shown in FIG. 9, the intensity of the light output from LED channel 370 may be controlled by controller 350 via voltage control signal 356 provided to voltage converter 314 and the responsive changes to output voltage 320. For example, the duty cycle of voltage control signal 356 may be set by controller 350 to set the output voltage 320 from buck converter 301 based on a desired output (i.e. a desired intensity captured from input device 206) from the lighting apparatus 700 and the value of sense current 332. Alternatively, the frequency of voltage control signal 356 may be set by controller 350 to set the output voltage 320 in other embodiments. For example, the duty cycle of voltage control signal 356 may be reduced by controller 350 to cause a corresponding reduction in output voltage 320 from buck converter 301. As a result of the reduced output voltage 320, the total current $I_T$ passing through LED channel 370 will be reduced causing a reduction in light output from LED channel 370. Similarly, the controller 350 may increase the duty cycle of control signal 356 to cause a corresponding increase in the output voltage 320 to increase the total current passing $I_T$ through LED channel 370 to increase the intensity of light output from same. In this manner, the intensity of the light output from lighting apparatus 700 may be controlled to permit dimming using a constant voltage power supply 311 having a fixed output voltage without applying a PWM signal to each LED channel or the LED channels collectively. Instead, the current flowing through the LED channel(s) may be controlled by modifying the output voltage 320 from the voltage converter 314, which may be implemented as buck converter 301 in certain embodiments.

Current sense module 330 may operate in a similar manner to that previously described, however, the sampling of sense current 332 may be simplified because LED channel 370 is not being pulse width modulated under the control of the channel control signals as previously described.

Controller 350 may use the current sense voltage 334 to estimate sense current 332 as previously described. As the intensity of the light output from LED channel 370 is proportional to the sense current 332, voltage control signal 356 may be set and adjusted based on the sense current 332 to achieve the desired light output from lighting apparatus 700.

In other embodiments, a lighting apparatus may be constructed comprising a single power supply and controller that may be coupled to multiple light engines, with each light engine comprising a voltage converter, current sense circuit, and at least one LED channel. A first of these light engines may contain an LED channel comprising at least a subset of LEDs having a first colour or colour temperature. A second of these circuits may contain an LED channel comprising at least a subset of LEDs having a second colour or colour temperature. The controller may set the current through the voltage converters of each light engine to set the relative intensity of light output from each light engine to therefore set the colour or colour temperature of the light output from the lighting apparatus in a manner similar to that described previously.

Additional details of lighting apparatus incorporating voltage converters that may be used with the current sense circuits disclosed herein are described in U.S. Provisional Patent Application No. 61/507,117 entitled "Dimmable LED Lighting Architecture Incorporating a Voltage Converter" filed Jul. 12, 2011 by Briggs, which is hereby incorporated by reference.

Although various embodiments of the present invention have been described and illustrated, it will be apparent to those skilled in the art that numerous modifications and variations can be made without departing from the scope of the invention, which is defined in the appended claims.

What is claimed is:

1. A circuit comprising:
 a voltage converter operable to receive an input voltage and generate an output voltage defined between a high voltage rail and a low voltage rail coupled to the output of the voltage converter;
 a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and
 a current determination apparatus coupled to the current sense circuit and operable to sample a current sense voltage at the node during the second state;
 wherein the voltage converter is operable to receive a voltage control signal to selectively allow the sense current to flow to the current sense circuit and the current determination apparatus is operable to sample the current sense voltage when the voltage converter is set to allow the sense current to flow to the current sense circuit.

2. The circuit of claim 1, further comprising at least one LED coupled between the high voltage rail and the low voltage rail.

3. The circuit according to claim 2, further comprising a switching element coupled in series with the at least one LED between the high voltage rail and the low voltage rail, wherein the current sense circuit is within the second state during at least a portion of the time that the switching element is activated to allow a current to flow through the at least one LED.

4. The circuit according to claim 3, wherein the current determination apparatus is further operable to control the switching element to selectively allow a current to flow through the at least one LED.

5. The circuit of claim 1, wherein the current determination apparatus is further operable to determine the sense current based at least partially on the current sense voltage.

6. The circuit of claim 1, wherein the voltage converter is operable to generate an output voltage that is lower than the input voltage by increasing the voltage applied to the low voltage rail.

7. The circuit of claim 1, wherein the voltage converter is operable to generate an output voltage that is lower than the input voltage by decreasing the voltage applied to the high voltage rail.

8. The circuit of claim 1, wherein the current determination apparatus is operable to take multiple samples of the current sense voltage at different times and determine an average of the current sense voltage.

9. The circuit according to claim 1, wherein the current determination apparatus is further operable to control the at least one transistor within the current sense circuit.

10. The circuit according to claim 1, wherein the current sense circuit is operated in the first state substantially more than in the second state to reduce the average resistance of the current sense circuit.

11. The circuit according to claim 1, wherein the current determination apparatus is further operable to determine the sense current during the first state of the current sense circuit based at least partially on data related to the current sense voltage sampled during the second state of the current sense circuit.

12. A circuit comprising:
a voltage converter operable to receive an input voltage and generate an output voltage, defined between a high voltage rail and a low voltage rail coupled to the output of the voltage converter, the output voltage being based at least partially on a voltage control signal received by the voltage converter;
at least one LED channel coupled between the high voltage rail and the low voltage rail;
a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and
a controller operable to sample a current sense voltage at the node during the second state and to set the voltage control signal based at least partially on data related to the current sense voltage to set the output voltage.

13. The circuit of claim 12, wherein the current sense voltage is sampled by the controller when the voltage converter is set to allow the sense current to flow to the current sense circuit.

14. The circuit according to claim 13, further comprising a switching element coupled in series with the at least one LED channel between the high voltage rail and the low voltage rail, wherein the current sense circuit is within the second state during at least a portion of the time that the switching element is activated to allow a current to flow through the at least one LED channel.

15. The circuit of claim 14, wherein the current determination apparatus is operable to take multiple samples of the current sense voltage at different times and determine an average of the current sense voltage.

16. A method of controlling a lighting circuit comprising:
operating a current sense circuit in a first state when not sampling a current sense voltage;
setting the current sense circuit to a second state and sampling the current sense voltage when the current sense circuit is in the second state; and
setting a voltage control signal to set an output voltage of a voltage converter based at least partially on data related to the current sense voltage.

17. The method of claim 16, wherein the resistance of the current sense circuit in the first state is less than the resistance of the current sense circuit in the second state.

18. The method of claim 16, wherein the current sense circuit is operated in the first state when at least one transistor that is coupled in parallel with a resistor is activated to allow a current to flow through the at least one transistor.

19. The method of claim 16, wherein the current sense circuit is operated in the second state when at least one transistor that is coupled in parallel with a resistor is deactivated to prevent a current from flowing through the at least one transistor.

20. The method of claim 16, wherein the current sense voltage is sampled when a current is permitted to flow to the current sense circuit.

21. The method of claim 16, further comprising
periodically setting the current sense circuit to the second state and sampling the current sense voltage when the current sense circuit is in the second state at different times to obtain a sample set;
determining an average current sense voltage based on the sample set; and
setting the voltage control signal to set the output voltage of a voltage converter based at least partially on data related to the average current sense voltage.

22. A circuit comprising:
a voltage converter operable to receive an input voltage and generate an output voltage defined between a high voltage rail and a low voltage rail coupled to the output of the voltage converter;
a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and
a current determination apparatus coupled to the current sense circuit and operable to sample a current sense voltage at the node during the second state and to determine the sense current based at least partially on the current sense voltage.

23. A circuit comprising:
a voltage converter operable to receive an input voltage and generate an output voltage defined between a high voltage rail and a low voltage rail coupled to the output of the voltage converter;
a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; and a current determination apparatus coupled to the current sense circuit and operable to sample a current sense voltage at the node during the second state; wherein the current determination apparatus is operable to take multiple samples of the current sense voltage at different times and determine an average of the current sense voltage.

24. The circuit according to claim 23, wherein the current determination apparatus is further operable to control the switching element to selectively allow a current to flow through the at least one LED.

25. A circuit comprising:

a voltage converter operable to receive an input voltage and generate an output voltage defined between a high voltage rail and a low voltage rail coupled to the output of the voltage converter;

a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state;

a current determination apparatus coupled to the current sense circuit and operable to sample a current sense voltage at the node during the second state;

at least one LED coupled between the high voltage rail and the low voltage rail; and a switching element coupled in series with the at least one LED between the high voltage rail and the low voltage rail, wherein the current sense circuit is within the second state during at least a portion of the time that the switching element is activated to allow a current to flow through the at least one LED.

26. A circuit comprising:

a voltage converter operable to receive an input voltage and generate an output voltage defined between a high voltage rail and a low voltage rail coupled to the output of the voltage converter;

a current sense circuit coupled to the voltage converter at a node to receive a sense current, the current sense circuit comprising a resistor coupled in parallel with at least one transistor, the at least one transistor being activated during a first state of the current sense circuit to reduce the resistance of the current sense circuit and being deactivated during a second state; wherein the current sense circuit is operated in the first state substantially more than in the second state to reduce the average resistance of the current sense circuit; and a current determination apparatus coupled to the current sense circuit and operable to sample a current sense voltage at the node during the second state.

* * * * *